United States Patent
Cok et al.

(10) Patent No.: US 10,332,868 B2
(45) Date of Patent: Jun. 25, 2019

(54) STACKED PIXEL STRUCTURES

(71) Applicant: X-Celeprint Limited, Cork (IE)

(72) Inventors: Ronald S. Cok, Rochester, NY (US); Brook Raymond, Cary, NC (US); Christopher Andrew Bower, Raleigh, NC (US)

(73) Assignee: X-Celeprint Limited, Cork (IE)

( * ) Notice: Subject to any disclaimer, the term of this patent is extended or adjusted under 35 U.S.C. 154(b) by 0 days.

(21) Appl. No.: 15/876,949

(22) Filed: Jan. 22, 2018

(65) Prior Publication Data

US 2018/0211945 A1 Jul. 26, 2018

Related U.S. Application Data

(60) Provisional application No. 62/450,866, filed on Jan. 26, 2017.

(51) Int. Cl.
*H01L 27/16* (2006.01)
*H01L 27/07* (2006.01)
(Continued)

(52) U.S. Cl.
CPC .......... *H01L 25/167* (2013.01); *G09G 3/2088* (2013.01); *G09G 3/32* (2013.01);
(Continued)

(58) Field of Classification Search
CPC ... H01L 25/167; H01L 25/0753; H01L 25/13; H01L 33/0079; H01L 33/62; G09G 3/2088; G09G 3/32
See application file for complete search history.

(56) References Cited

U.S. PATENT DOCUMENTS 5,994,722 A 11/1999 Averbeck et al.
6,142,358 A 11/2000 Cohn et al.
(Continued)

FOREIGN PATENT DOCUMENTS

WO WO-2010/111601 A2 9/2010
WO WO-2010/132552 A1 11/2010
(Continued)

OTHER PUBLICATIONS

Ogihara, Mitsuhiko, Latest Trend of High Definition LED Printheads, Oki Technical Review, 208(73)(4):28-31, 2006.
(Continued)

*Primary Examiner* — Ida M Soward
(74) *Attorney, Agent, or Firm* — William R. Haulbrook; Michael D. Schmitt; Choate, Hall & Stewart LLP

(57) ABSTRACT

A micro-transfer printed high-resolution inorganic light-emitting diode (iLED) display includes a display substrate and a plurality of pixels disposed over the display substrate, each pixel including a pixel controller disposed or formed in or on a pixel substrate and controlling one or more iLEDs disposed or formed in or on respective iLED substrates. The one or more iLEDs are disposed above or below the pixel controller in a separate layer from the pixel controller. The display substrate, the iLED substrate(s), and the pixel substrate are all separate, independent and distinct, and the one or more iLEDs and pixel controller are each separate devices.

19 Claims, 14 Drawing Sheets

(51) Int. Cl.

| | | |
|---|---|---|
| *H01L 27/13* | (2006.01) | |
| *H01L 33/00* | (2010.01) | |
| *H01L 33/62* | (2010.01) | |
| *H01L 25/16* | (2006.01) | |
| *H01L 25/075* | (2006.01) | |
| *H01L 25/13* | (2006.01) | |
| *G09G 3/32* | (2016.01) | |
| *G09G 3/20* | (2006.01) | |

(52) U.S. Cl.
CPC .......... *H01L 25/0753* (2013.01); *H01L 25/13* (2013.01); *H01L 33/0079* (2013.01); *H01L 33/62* (2013.01); *H01L 2224/18* (2013.01); *H01L 2933/0066* (2013.01)

(56) References Cited

U.S. PATENT DOCUMENTS

| | | |
|---|---|---|
| 7,195,733 B2 | 3/2007 | Rogers et al. |
| 7,521,292 B2 | 4/2009 | Rogers et al. |
| 7,557,367 B2 | 7/2009 | Rogers et al. |
| 7,622,367 B1 | 11/2009 | Nuzzo et al. |
| 7,629,955 B2 | 12/2009 | Asao et al. |
| 7,662,545 B2 | 2/2010 | Nuzzo et al. |
| 7,704,684 B2 | 4/2010 | Rogers et al. |
| 7,799,699 B2 | 9/2010 | Nuzzo et al. |
| 7,816,856 B2 | 10/2010 | Cok et al. |
| 7,927,976 B2 | 4/2011 | Menard |
| 7,932,123 B2 | 4/2011 | Rogers et al. |
| 7,943,491 B2 | 5/2011 | Nuzzo et al. |
| 7,972,875 B2 | 7/2011 | Rogers et al. |
| 7,982,296 B2 | 7/2011 | Nuzzo et al. |
| 7,990,058 B2 | 8/2011 | Cok et al. |
| 8,039,847 B2 | 10/2011 | Nuzzo et al. |
| 8,058,663 B2 | 11/2011 | Fan et al. |
| 8,198,621 B2 | 6/2012 | Rogers et al. |
| 8,394,706 B2 | 3/2013 | Nuzzo et al. |
| 8,440,546 B2 | 5/2013 | Nuzzo et al. |
| 8,506,867 B2 | 8/2013 | Menard |
| 8,664,699 B2 | 3/2014 | Nuzzo et al. |
| 8,722,458 B2 | 5/2014 | Rogers et al. |
| 8,754,396 B2 | 6/2014 | Rogers et al. |
| 8,766,970 B2 | 7/2014 | Chien et al. |
| 8,791,474 B1 | 7/2014 | Bibl et al. |
| 8,794,501 B2 | 8/2014 | Bibl et al. |
| 8,803,857 B2 | 8/2014 | Cok |
| 8,877,648 B2 | 11/2014 | Bower et al. |
| 8,889,485 B2 | 11/2014 | Bower |
| 8,895,406 B2 | 11/2014 | Rogers et al. |
| 9,252,375 B2* | 2/2016 | Bibl .......... H01L 51/50 |
| 9,362,348 B2* | 6/2016 | Lowenthal .......... H01L 27/3281 |
| 9,368,683 B1 | 6/2016 | Meitl et al. |
| 9,437,782 B2 | 9/2016 | Bower et al. |
| 9,444,015 B2 | 9/2016 | Bower et al. |
| 9,520,537 B2 | 12/2016 | Bower et al. |
| 9,537,069 B1 | 1/2017 | Bower et al. |
| 9,698,308 B2 | 7/2017 | Bower et al. |
| 9,705,042 B2 | 7/2017 | Bower et al. |
| 9,716,082 B2 | 7/2017 | Bower et al. |
| 9,741,785 B2 | 8/2017 | Bower et al. |
| 9,818,725 B2 | 11/2017 | Bower et al. |
| 9,847,047 B2* | 12/2017 | Wu .......... G09G 3/006 |
| 9,871,345 B2 | 1/2018 | Bower et al. |
| 9,980,341 B2 | 5/2018 | Bower et al. |
| 9,997,501 B2* | 6/2018 | Bower .......... H01L 25/0753 |
| 10,008,483 B2* | 6/2018 | Cok .......... H01L 25/0753 |
| 10,103,069 B2* | 10/2018 | Bower .......... H01L 25/167 |
| 2001/0022564 A1 | 9/2001 | Youngquist et al. |
| 2002/0096994 A1 | 7/2002 | Iwafuchi et al. |
| 2005/0264472 A1 | 12/2005 | Rast |
| 2005/0275615 A1 | 12/2005 | Kahen et al. |
| 2006/0063309 A1 | 3/2006 | Sugiyama et al. |
| 2006/0289972 A1 | 12/2006 | Nishimura et al. |
| 2008/0108171 A1 | 5/2008 | Rogers et al. |
| 2008/0211734 A1 | 9/2008 | Huitema et al. |
| 2009/0146921 A1 | 6/2009 | Takahashi |
| 2009/0278142 A1 | 11/2009 | Watanabe et al. |
| 2010/0060553 A1 | 3/2010 | Zimmerman et al. |
| 2010/0123268 A1 | 5/2010 | Menard |
| 2010/0148198 A1 | 6/2010 | Sugizaki et al. |
| 2010/0149117 A1 | 6/2010 | Chien et al. |
| 2010/0186883 A1 | 7/2010 | Tomoda |
| 2010/0201253 A1 | 8/2010 | Cok et al. |
| 2010/0207852 A1 | 8/2010 | Cok |
| 2010/0248484 A1 | 9/2010 | Bower et al. |
| 2010/0317132 A1 | 12/2010 | Rogers et al. |
| 2011/0043435 A1 | 2/2011 | Hebenstreit et al. |
| 2011/0108800 A1 | 5/2011 | Pan |
| 2012/0126229 A1 | 5/2012 | Bower |
| 2012/0206499 A1 | 8/2012 | Cok |
| 2012/0212465 A1* | 8/2012 | White .......... G09G 3/2085 345/205 |
| 2012/0228669 A1 | 9/2012 | Bower et al. |
| 2012/0314388 A1 | 12/2012 | Bower et al. |
| 2012/0320581 A1 | 12/2012 | Rogers et al. |
| 2013/0010405 A1 | 1/2013 | Rothkopf et al. |
| 2013/0015483 A1* | 1/2013 | Shimokawa .......... H01L 24/96 257/98 |
| 2013/0036928 A1 | 2/2013 | Rogers et al. |
| 2013/0069275 A1 | 3/2013 | Menard et al. |
| 2013/0128585 A1 | 5/2013 | Bibl et al. |
| 2013/0153277 A1 | 6/2013 | Menard et al. |
| 2013/0153934 A1 | 6/2013 | Meitl et al. |
| 2013/0196474 A1 | 8/2013 | Meitl et al. |
| 2013/0221355 A1 | 8/2013 | Bower et al. |
| 2013/0248889 A1 | 9/2013 | Lin |
| 2013/0273695 A1 | 10/2013 | Menard et al. |
| 2014/0014960 A1 | 1/2014 | Yamazaki et al. |
| 2014/0027709 A1 | 1/2014 | Higginson et al. |
| 2014/0084482 A1 | 3/2014 | Hu et al. |
| 2014/0159043 A1 | 6/2014 | Sakariya et al. |
| 2014/0159065 A1 | 6/2014 | Hu et al. |
| 2014/0264763 A1 | 9/2014 | Meitl et al. |
| 2014/0267683 A1 | 9/2014 | Bibl et al. |
| 2014/0306248 A1 | 10/2014 | Ahn et al. |
| 2014/0339495 A1 | 11/2014 | Bibl et al. |
| 2014/0340900 A1 | 11/2014 | Bathurst et al. |
| 2014/0367633 A1 | 12/2014 | Bibl et al. |
| 2014/0367705 A1 | 12/2014 | Bibl et al. |
| 2015/0084054 A1* | 3/2015 | Fan .......... G02F 1/00 257/72 |
| 2015/0135525 A1 | 5/2015 | Bower |
| 2015/0137153 A1 | 5/2015 | Bibl et al. |
| 2015/0169011 A1 | 6/2015 | Bibl et al. |
| 2015/0255438 A1* | 9/2015 | Oraw .......... H01L 25/0753 257/89 |
| 2015/0308634 A1 | 10/2015 | van de Ven et al. |
| 2015/0318328 A1 | 11/2015 | Bibl et al. |
| 2015/0327388 A1 | 11/2015 | Menard et al. |
| 2015/0371585 A1 | 12/2015 | Bower et al. |
| 2015/0371974 A1 | 12/2015 | Bower et al. |
| 2015/0372051 A1 | 12/2015 | Bower et al. |
| 2015/0372052 A1 | 12/2015 | Bower et al. |
| 2015/0372053 A1 | 12/2015 | Bower et al. |
| 2015/0372187 A1 | 12/2015 | Bower et al. |
| 2015/0373793 A1 | 12/2015 | Bower et al. |
| 2016/0005721 A1 | 1/2016 | Bower et al. |
| 2016/0018094 A1 | 1/2016 | Bower et al. |
| 2016/0064363 A1 | 3/2016 | Bower et al. |
| 2016/0093600 A1 | 3/2016 | Bower et al. |
| 2016/0343772 A1 | 11/2016 | Bower et al. |
| 2016/0351539 A1 | 12/2016 | Bower et al. |
| 2017/0005244 A1 | 1/2017 | Bower et al. |
| 2017/0025075 A1 | 1/2017 | Cok et al. |
| 2017/0025484 A1 | 1/2017 | Forrest et al. |
| 2017/0047393 A1 | 2/2017 | Bower et al. |
| 2017/0048976 A1 | 2/2017 | Prevatte et al. |
| 2017/0061842 A1 | 3/2017 | Cok et al. |
| 2017/0068362 A1 | 3/2017 | Den Boer et al. |
| 2017/0092863 A1 | 3/2017 | Bower et al. |
| 2017/0102797 A1 | 4/2017 | Cok |
| 2017/0122502 A1* | 5/2017 | Cok .......... G09G 3/32 |
| 2017/0133818 A1 | 5/2017 | Cok |
| 2017/0167703 A1 | 6/2017 | Cok |

(56) References Cited

U.S. PATENT DOCUMENTS

| | | | |
|---|---|---|---|
| 2017/0186740 A1 | 6/2017 | Cok et al. | |
| 2017/0187976 A1 | 6/2017 | Cok | |
| 2017/0250167 A1* | 8/2017 | Bower | H01L 21/67144 |
| 2017/0250219 A1 | 8/2017 | Bower et al. | |
| 2017/0256521 A1 | 9/2017 | Cok et al. | |
| 2017/0256522 A1 | 9/2017 | Cok et al. | |
| 2017/0287882 A1 | 10/2017 | Cok et al. | |
| 2017/0352646 A1 | 12/2017 | Bower et al. | |
| 2017/0352647 A1* | 12/2017 | Raymond | H01L 25/0753 |
| 2017/0357127 A1 | 12/2017 | Cok et al. | |
| 2017/0358717 A1 | 12/2017 | Cok et al. | |
| 2018/0033853 A1 | 2/2018 | Bower et al. | |
| 2018/0041005 A1 | 2/2018 | Bower et al. | |
| 2018/0084614 A1 | 3/2018 | Bower et al. | |
| 2018/0119931 A1 | 5/2018 | Bower et al. | |
| 2018/0130400 A1* | 5/2018 | Meitl | G09G 3/2051 |
| 2018/0174932 A1* | 6/2018 | Cok | H01L 22/22 |
| 2018/0175248 A1* | 6/2018 | Ahmed | H01L 33/44 |
| 2018/0197471 A1* | 7/2018 | Rotzoll | G09G 3/3233 |
| 2018/0226386 A1 | 8/2018 | Cok | |
| 2018/0277525 A1* | 9/2018 | Cok | H01L 25/0753 |
| 2018/0366450 A1* | 12/2018 | Gardner | H01L 25/0753 |

FOREIGN PATENT DOCUMENTS

| | | |
|---|---|---|
| WO | WO-2013/064800 A1 | 5/2013 |
| WO | WO-2015/193434 A2 | 12/2015 |
| WO | WO-2016/030422 A1 | 3/2016 |
| WO | WO-2016/046283 A2 | 3/2016 |
| WO | WO-2017/042252 A1 | 3/2017 |
| WO | WO-2017/060487 A2 | 4/2017 |
| WO | WO-2017/149067 A1 | 9/2017 |
| WO | WO-2017/174632 A1 | 10/2017 |

OTHER PUBLICATIONS

Choi, H. W. et al., Efficient GaN-based Micro-LED Arrays, Mat. Res. Soc. Symp. Proc. 743:L6.28.1-L6.28.6 (2003).

Cok, R. S. et al., AMOLED displays with transfer-printed integrated circuits, Journal of SID, 19(4):335-341 (2011).

Cok, R. S. et al., Inorganic light-emitting diode displays using micro-transfer printing, Journal of the SID, 25(10):589-609, (2017).

Hamer et al., 63.2: AMOLED Displays Using Transfer-Printed Integrated Circuits, SID 09 Digest, 40(2):947-950 (2009).

Yoon, J. et al., Heterogeneously Integrated Optoelectronic Devices Enabled by MicroTransfer Printing, Adv. Optical Mater. 3:1313-1335 (2015).

\* cited by examiner

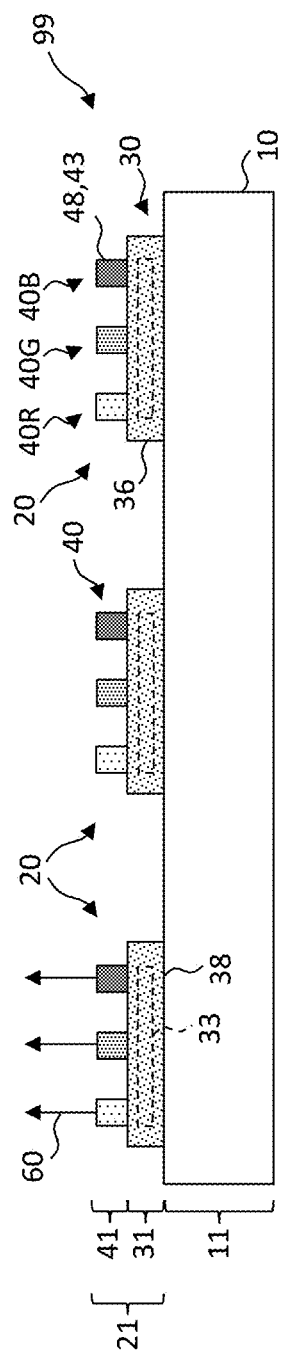
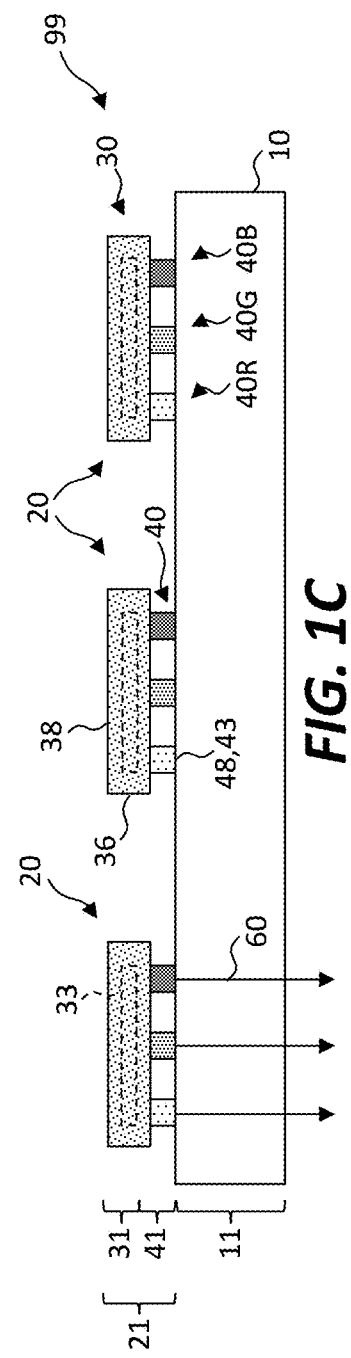

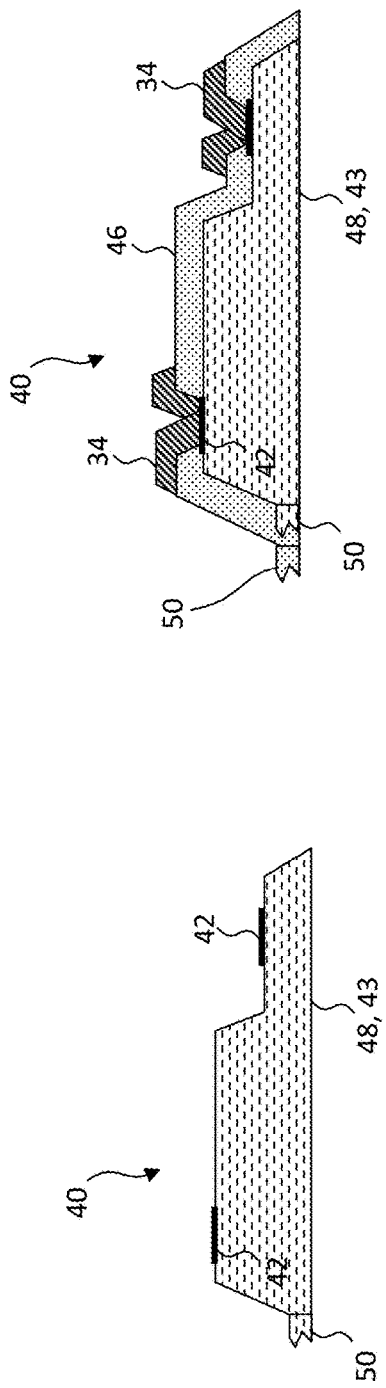
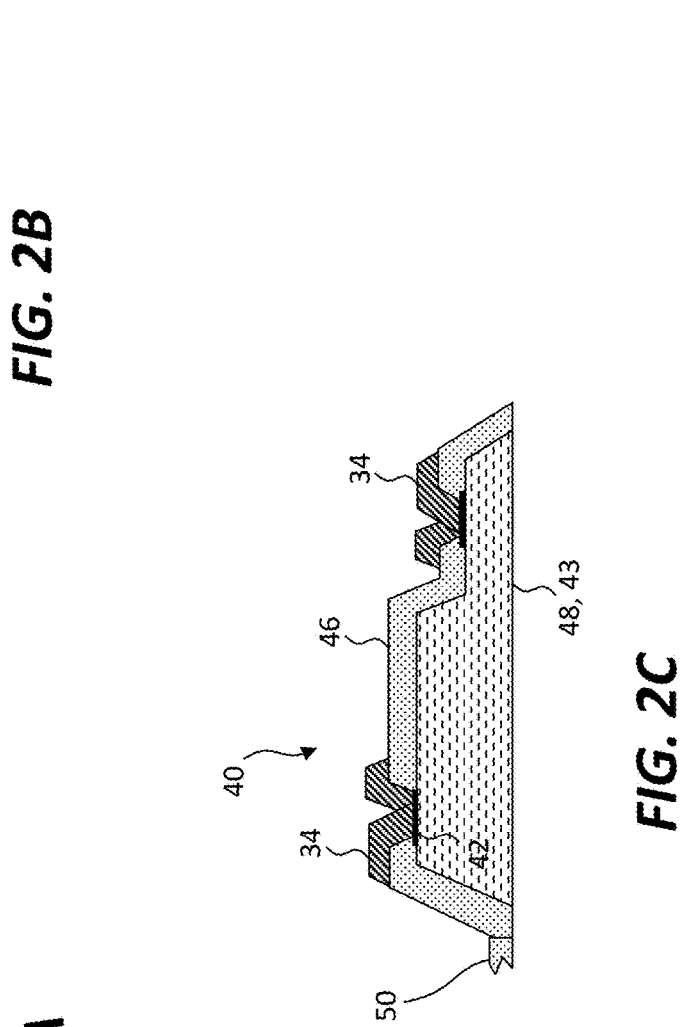
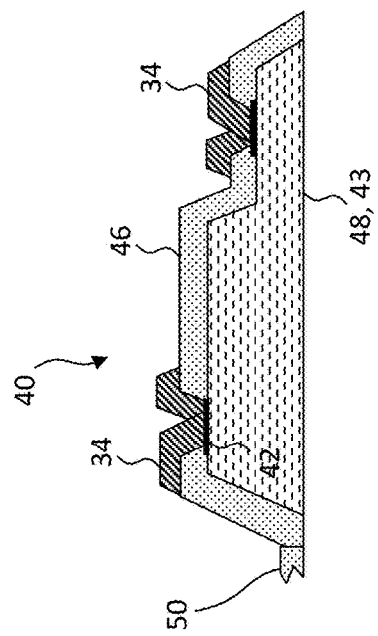
FIG. 2A
FIG. 2B
FIG. 2C

STACKED PIXEL STRUCTURES

PRIORITY APPLICATION

This application claims the benefit of U.S. Provisional Patent Application No. 62/450,866, filed Jan. 26, 2017, entitled Stacked Pixel Structure, the disclosure of which is incorporated by reference herein in its entirety.

FIELD OF THE INVENTION

The present invention relates generally to physical pixel structures in a display and in particular to structures with stacked inorganic light emitters and pixel controllers.

BACKGROUND OF THE INVENTION

Flat-panel displays have an array of pixels distributed in a display viewing area over a display substrate. The pixels are electrically controlled using matrix addressing with the intersection of row and column wires on the substrate defining pixel locations and from which rows of pixels in the array are sequentially provided with control signals. Passive-matrix control relies on row and column controllers external to the display viewing area to sequentially enable rows of pixels to emit light, so that only one row of pixels at a time emits light. Active-matrix control relies on local storage and control provided in the display viewing area for each pixel, for example with a storage capacitor and driving transistor and as disclosed in U.S. Pat. No. 9,117,940. Data is provided from an external column controller to selected rows of pixels in sequence and the rows are sequentially selected with a row controller. The pixels in each selected row receive data on the column wires and store the data locally in the pixel. Once the data is received and stored, it is displayed at each pixel by the control circuitry in the pixel by providing power to the pixel light controllers, for example electrodes controlling a liquid crystal (in the case of a liquid crystal display) or an organic light-emitting diode (in the case of an OLED display).

Resolution is an important performance attribute for displays and is calculated as the number of pixels, or light-emitters, per linear metric in one or both dimensions of the flat-panel display. For example, a display can have a resolution of 250 pixels per inch (ppi) or dots per inch (dpi). Commercially available cell phones have a resolution of 326 ppi. Typically, the resolution of a display is the same in both orthogonal (x, y) display dimensions over the surface of the display, but it is not necessarily so. In general, a greater resolution is preferred because more information can be displayed in a more pleasing way on a higher-resolution display.

Increased resolution displays are made using manufacturing processes having reduced tolerances and reduced component sizes, as well as requiring increased operating power and are typically achieved in an active-matrix display by reducing the size of the control circuitry, for example including the wires, light-control electrodes, transistors, and capacitors in a pixel circuit. However, this size reduction increases manufacturing costs and there are limits to the reduction in size of the circuits, especially in flat-panel displays that rely on layers of amorphous silicon or poly-silicon to form the circuits.

Active-matrix liquid crystal displays (LCD) circuits generally require only one transistor to control the liquid crystals and therefore do not use much area on a display substrate. Organic light-emitting diode (OLED) displays typically require larger and more complex control circuits than LCDs. The larger circuits increase the size of the OLED pixels for bottom-emitting displays that emit light through the substrate, since the substrate area must be shared between the pixel circuits and the OLED light-emitters. Top-emitting OLED displays locate the OLED light emitters in a layer over the pixel circuits and are not as limited in resolution by the size of the pixel circuit. In both cases, pixels are preferably as large as possible to increase display brightness and lifetime of the OLEDs. For both of these technologies, control circuits are implemented in thin-film layers of silicon provided over the flat-panel display substrate; as the size of the display substrate increases so does the cost of providing high-quality silicon over the substrate.

Inorganic light-emitting diode (iLED) displays have many advantages, such as efficiency, color purity, and lifetime, and are found today in digital signage and large-format displays, for example in sporting venues. The iLEDs in these displays are mounted in a display frame, for example in an array of tiles, and controlled by circuitry external to the display frame. It is difficult, therefore to construct a high-resolution iLED display. Existing iLED displays often have pixel pitches of approximately 1 mm (25 ppi), a relatively low resolution, especially compared to flat-panel displays.

One approach to providing high-performance electronic circuits distributed over a large display substrate is described in "AMOLED Displays using Transfer-Printed Integrated Circuits" published in the Proceedings of the 2009 Society for Information Display International Symposium Jun. 2-5, 2009, in San Antonio Tex., US, vol. 40, Book 2, ISSN 0009-0966X, paper 63.2 p. 947. In this approach, small integrated circuits are formed over a buried oxide layer on the process side of a crystalline wafer. The small integrated circuits, or chiplets, are released from the wafer by etching the buried oxide layer formed beneath the circuits. A PDMS stamp is pressed against the wafer and the process side of the chiplets is adhered to the stamp. The chiplets are pressed against a destination substrate or backplane coated with an adhesive and thereby adhered to the destination substrate. The adhesive is subsequently cured, electrodes are formed, and OLED material layers evaporated over the substrate to form light-emitting pixels.

In another example, U.S. Pat. No. 8,722,458 entitled Optical Systems Fabricated by Printing-Based Assembly teaches transferring light-emitting, light-sensing, or light-collecting semiconductor elements from a wafer substrate to a destination substrate or backplane. U.S. Pat. No. 7,972,875 entitled Optical Systems Fabricated by Printing Based Assembly discloses assembling printable semiconductor elements on a substrate via contact printing. U.S. Patent Publication No. 2016/0351539 entitled Inorganic-Light-Emitter displays with Integrated Black Matrix describes an inorganic light-emitting display with micro-transfer printed light-emitting diodes and pixel controllers distributed over a flat-panel display substrate with an integrated black matrix. Certain embodiments of such approaches provide an LED display with improved optical performance but there remains a need for inorganic LED displays with increased resolution and pixel structures that facilitate such increased resolution.

SUMMARY OF THE INVENTION

The present invention provides, inter alia, a high-resolution inorganic light-emitting diode (iLED) display that comprises a display substrate having a display area and a plurality of pixels disposed over the display substrate in the display area. Each pixel comprises a pixel control device and one or more inorganic light-emitting diode (iLED) devices electrically controlled by the pixel control device to emit light. The pixel control devices each include a pixel controller that is disposed on or formed in, on, or in direct contact with a pixel substrate separate, independent, and distinct from the display substrate. The iLED devices each include an iLED that is disposed on or formed in, on, or in direct contact with an iLED substrate separate, independent, and distinct from the display substrate and from the pixel substrate. The one or more iLED devices are disposed in direct contact with the pixel control device and do not extend beyond the pixel controller and the one or more iLED devices have in combination an area over the pixel controller that is smaller than the area of the pixel controller over the display substrate. The pixel controller is disposed in a controller layer over the display substrate and the iLED devices are disposed in an iLED layer different from the controller layer over the display substrate.

In certain embodiments, a micro-assembled pixel comprises a pixel control device including a pixel controller and a pixel substrate. The pixel controller is formed or disposed in, on, or in direct contact with the pixel substrate. One or more inorganic light-emitting diode (iLED) devices each include an iLED and an iLED substrate separate, independent, and distinct from the pixel substrate. The iLEDs are formed or disposed in, on, or in direct contact with the iLED substrate and are electrically controlled by the pixel controller to emit light. The one or more iLED devices are disposed in direct contact with the pixel control device and do not extend beyond the pixel controller. The one or more iLED devices have in combination an area over the pixel controller that is smaller than the area of the pixel controller surface on which the iLEDs are disposed and the pixel controller is disposed in a controller layer and the iLEDs are disposed in an iLED layer different from the controller layer over the pixel controller.

In certain embodiments, a method of micro-assembling a pixel comprises providing a pixel control device having a pixel substrate and an iLED device source wafer having a plurality of iLED devices each including an iLED that is disposed or formed in, on, or in direct contact with an iLED substrate separate, independent, and distinct from the pixel substrate. An iLED device is micro-transfer printed from the iLED device source wafer onto the pixel control device so that the iLED device is in an iLED layer and the pixel control device is in a controller layer different from the iLED layer. The iLED is electrically connected to the pixel controller.

The present invention provides, inter alia, an inorganic LED display having increased pixel resolution and improved performance control circuits, for example monocrystalline silicon circuits. In certain embodiments, structures of the present invention can be made using micro-transfer printing, enabling the use of micro-LEDs and micro-controllers having lateral dimensions less than or equal to 100, 50, 25, 15, 10, 5, or 3 microns.

In one aspect, the present invention is directed to a high-resolution inorganic light-emitting diode (iLED) display, comprising: a display substrate having a display area; and a plurality of pixels disposed over the display substrate in the display area, each pixel comprising a pixel control device and one or more inorganic light-emitting diode (iLED) devices electrically connected to and controlled by the pixel control device to emit light, wherein: the pixel control devices each comprise a pixel controller that is disposed or formed in, on, or in direct contact with a pixel substrate separate, independent, and distinct from the display substrate, the one or more iLED devices each comprise an iLED that is disposed or formed in, on, or in direct contact with an iLED substrate separate, independent, and distinct from the display substrate and from the pixel substrates, the one or more iLED devices are disposed in direct contact with the pixel control device and do not extend beyond the pixel controller, and the pixel controller is disposed in a controller layer over the display substrate and the one or more iLED devices are disposed in an iLED layer different from the controller layer over the display substrate.

In certain embodiments, the iLED layer is disposed between the controller layer and the display substrate, the display substrate is at least partly transparent to the light emitted by the iLED, and the iLED is disposed to emit light through the display substrate. In certain embodiments, the controller layer is disposed between the iLED layer and the display substrate and the iLEDs are disposed to emit light in a direction away from the display substrate.

In certain embodiments, one or more of the one or more iLED devices, the iLED substrate, the pixel control device, and the pixel substrate comprises a broken or separated tether.

In certain embodiments, the iLED substrate comprises a semiconductor iLED substrate or a dielectric iLED substrate.

In certain embodiments, the pixel control device comprises connection posts electrically connecting the pixel controller to the display substrate. In certain embodiments, the iLED substrate comprises a broken or separated tether.

In certain embodiments, the one or more iLED devices comprises three iLED devices disposed in the iLED layer, wherein each of the iLEDs of the three iLED devices emit light of a different color than the iLED of each other iLED device of the three iLED devices.

In certain embodiments, the one or more iLED devices each comprises connection posts electrically connecting the iLED to at least one of (i) the pixel controller of the pixel control device on which the iLED device is disposed and (ii) the display substrate.

In certain embodiments, the pixel substrate comprises a semiconductor pixel substrate or a dielectric pixel substrate. In certain embodiments, the pixel substrate comprises a broken or separated tether.

In another aspect, the present invention is directed to a micro-assembled pixel, comprising: a pixel control device comprising a pixel controller and a pixel substrate, the pixel controller formed or disposed in, on, or in direct contact with the pixel substrate; and one or more inorganic light-emitting diode (iLED) devices, each comprising an iLED and an iLED substrate separate, independent, and distinct from the pixel substrate, the iLED formed or disposed in, on, or in direct contact with the iLED substrate and electrically connected to and controlled by the pixel controller to emit light, wherein the one or more iLED devices are disposed in direct contact with the pixel control device and do not extend beyond the pixel controller, and the pixel controller is disposed in a controller layer and the one or more iLED devices are disposed in an iLED layer different from the controller layer over the pixel controller.

In certain embodiments, (i) the one or more iLED devices each comprise a broken or separated tether or (ii) the pixel control device comprises a broken or separated tether, or both (i) and (ii).

In certain embodiments, the iLED substrate comprises a semiconductor iLED substrate or a dielectric iLED substrate.

In certain embodiments, the pixel control device comprises connection posts electrically connected to the pixel controller. In certain embodiments, the one or more iLED devices each comprises connection posts electrically connecting the iLED to the pixel controller.

In certain embodiments, the iLED substrate comprises a broken or separated tether.

In certain embodiments, the pixel substrate comprises a semiconductor pixel substrate or a dielectric pixel substrate. In certain embodiments, the pixel substrate comprises a broken or separated tether.

In another aspect, the present invention is directed to a method of micro-assembling a pixel, comprising: providing a pixel control device comprising a pixel substrate and a pixel controller; providing an iLED source wafer comprising a plurality of iLED devices each comprising an iLED that is disposed or formed in, on, or in direct contact with an iLED substrate separate, independent, and distinct from the pixel substrate; micro-transfer printing an iLED device from the iLED source wafer onto the pixel substrate of the pixel control device such that the iLED device is in an iLED layer and the pixel control device is in a controller layer different from the iLED layer; and electrically connecting the iLED of the iLED device to the pixel controller.

In certain embodiments, the method comprises providing a pixel control device source wafer having one or more pixel control devices disposed or formed in, on, or in direct contact with the pixel controller source wafer; micro-transfer printing an iLED device from the iLED source wafer onto each of the one or more pixel control devices; and electrically connecting each iLED to the corresponding pixel controller on which the LED is micro-transfer printed.

In certain embodiments, the iLED device comprises two or more connection posts electrically connected to the iLED and the step of micro-transfer printing the iLED device onto the pixel control device electrically connects the iLED to the pixel controller.

In certain embodiments, the method comprises micro-transfer printing two or more different iLED devices, each from a different iLED source wafer, to the pixel control device and electrically connecting the two or more different iLED devices to the pixel controller.

In another aspect, the present invention is directed to a method of making a high-resolution iLED display, comprising: providing a display substrate having a display area; providing a pixel control device source wafer having a plurality of pixel control devices formed or disposed on, in, or in direct contact with the pixel control device source wafer, each of the plurality of pixel control devices comprising a pixel controller formed in or on (e.g., printed on) a pixel substrate; providing one or more iLED devices for each of the plurality of pixel control devices, wherein each of the one or more iLED devices comprises an iLED; electrically connecting the one or more iLED devices to each pixel control device, wherein the one or more iLED devices are disposed in direct contact with the pixel substrate of the pixel control device and do not extend beyond the pixel controller; micro-transfer printing the plurality of pixel control devices from the pixel control device source wafer onto the display substrate in the display area, wherein the plurality of pixel control devices are disposed in a controller layer over the display substrate and the one or more iLED devices disposed on the pixel substrate of each of the plurality of pixel control devices are disposed in an iLED layer different from the controller layer over the display substrate; and electrically connecting the pixel controller of each of the plurality of pixel control devices to the display substrate.

In certain embodiments, each of the plurality of pixel control devices comprises two or more connection posts and the step of micro-transfer printing the plurality of pixel control devices onto the display substrate electrically connects the pixel controller of each of the plurality of pixel control devices to the display substrate.

In certain embodiments, the method comprises micro-transfer printing the plurality of pixel control devices onto the display substrate; and subsequently micro-transfer printing the one or more iLED devices for each of the plurality of pixel control devices onto the pixel control device and electrically connecting to the pixel controller of the pixel control device. In certain embodiments, the method comprises micro-transfer printing the one or more iLED devices for each of the plurality of pixel control devices onto the display substrate; subsequently micro-transfer printing the pixel control device onto or over the display substrate and electrically connecting the iLED of each of the one or more iLED devices is to the pixel controller of the pixel control device. In certain embodiments, the method comprises micro-transfer printing the one or more iLED devices for each of the plurality of pixel control devices onto the pixel control device; electrically connecting the iLED of each of the one or more iLED devices to the pixel controller; and subsequently micro-transfer printing the pixel control device with the one or more iLED devices disposed thereon onto the display substrate.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIG. 1B is a cross section schematic of an iLED display taken along cross section line A of FIG. 1A, according to illustrative embodiments of the present invention;

FIG. 1C is a cross section schematic of an iLED display taken along cross section line A of FIG. 1A, according to illustrative embodiments of the present invention;

FIGS. 2A, 2B, and 2C are cross section schematics illustrating iLED devices having tethers, according to illustrative embodiments of the present invention;

Figure 1A:
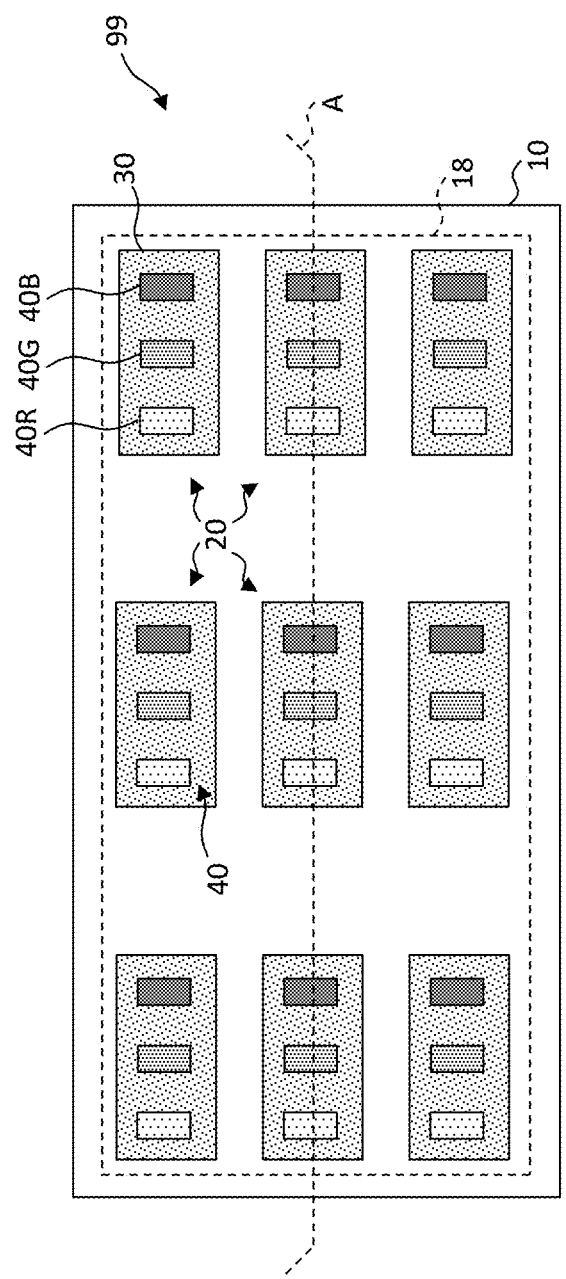
FIG. 1A is a plan view schematic of an iLED display, according to illustrative embodiments of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

Certain embodiments of the present invention provide an integrated pixel structure for inorganic light-emitting diodes (iLEDs) pixels in flat-panel displays that have increased resolution and improved performance. Micro-transfer printed pixel control circuits made in monocrystalline silicon, such as CMOS, can provide higher-performance in less space over a display substrate and micro-transfer printed micro-iLEDs can provide increased color saturation, lifetime, and efficiency in a flat-panel display. According to certain embodiments of the present invention, the iLEDs and the pixel control circuits have different, separate, independent, and distinct substrates and are provided in different layers over the same area of a display substrate, thereby reducing the pixel area over the display substrate and facilitating increased display resolution.

Referring to the plan view schematic illustrations of FIG. 1A and the cross section schematic illustration of FIGS. 1B and 1C taken across cross section line A of FIG. 1A, an exemplary embodiment of a high-resolution inorganic light-emitting diode (iLED) display 99 comprises a display substrate 10 having a display area 18 in a display substrate layer 11. A plurality of pixels 20 are disposed over, on, or in direct contact with the display substrate 10 in the display area 18. Each pixel 20 comprises a pixel control device 30 and one or more inorganic light-emitting diode (iLED) devices 40, for example red-, green-, and blue-light-emitting iLED devices 40R, 40G, and 40B, collectively iLED devices 40. The pixel control device 30 controls the iLED devices 40 to emit light.

Each pixel control device 30 includes a pixel controller 38 that is disposed or formed in, on, or in contact with a pixel substrate 36 separate, independent, and distinct from the display substrate 10. The iLED devices 40 each include an iLED 48 that is disposed or formed in or on an iLED substrate 43 separate, independent, and distinct from the display substrate 10 and from the pixel substrate 36. The one or more iLED devices 40 have in combination an area over the display substrate smaller than the pixel controller 38 area over the display substrate and are disposed in direct contact with the pixel control device 30 or a layer disposed on or over the pixel controller 38. For example, if the one or more iLED devices 40 include three iLED devices 40, the combined area of the three iLED devices 40 over the display substrate 10 is smaller than the area of the pixel controller 38 over the display substrate 10. A substrate that is separate, independent, and distinct from another substrate can be made separately at a different time or at a different location using different materials or methods than the other substrate. Each separate, independent, and distinct substrate can exist and be processed, transported, or manipulated independently of any other separate, independent, and distinct substrate.

The iLED 48 in each iLED device 40 is electrically controlled by the pixel controller 38 to emit light 60, for example by controlling the iLED 48 with electrical signals transmitted from the pixel controller 38 to the iLED 48 through wires (not shown in FIG. 1A, 1B, or 1C). For clarity, in FIGS. 1A, 1B, 1C, the pixel control devices 30, the pixel controllers 38, and the pixel substrate 36 are illustrated as a common structure. Similarly, the iLED devices 40, the iLEDs 48, and the iLED substrate 43 are illustrated as a common structure.

An iLEDs 48 can be formed in or on an iLED substrate 43, for example a semiconductor substrate or compound semiconductor substrate suitable for forming or providing inorganic light-emitting diodes so that the iLED substrate 43 is a semiconductor iLED substrate 43. Likewise, a pixel controller 38 can be formed in or on a pixel substrate 36, for example a semiconductor substrate suitable for forming integrated circuits so that the pixel substrate 36 is a semiconductor pixel substrate 36. In some embodiments, and as discussed below, one or more iLEDs 48 can be formed in a semiconductor structure that is disposed on a separate dielectric iLED substrate 43 or one or more pixel controllers 38 can be formed in a semiconductor structure that is disposed on a separate dielectric pixel substrate 36, or both.

In certain embodiments, iLED devices 40 include an iLED 48 and an iLED substrate 43, and can include additional structures such as patterned dielectric layers, electrical contacts, and electrical conductors. Similarly, in certain embodiments, pixel control devices 30 include a pixel controller 38 and a pixel substrate 36, and can include additional structures such as patterned dielectric layers, electrical contacts, and electrical conductors.

Referring to FIGS. 1B and 1C, the display substrate 10 is provided in a display substrate layer 11. The pixel control device 30 and pixel controller 38 are disposed over the display substrate layer 11 in a controller layer 31 different from the display substrate layer 11. The iLED devices 40 and iLEDs 48 are disposed over the display substrate layer 11 in an iLED layer 41 different from the controller layer 31 and different from the display substrate layer 11. A pixel control device 30 and one or more iLED devices 40 controlled by the pixel control device 30 can be, as shown in FIGS. 1A, 1B, and 1C, disposed over the same area or portion of the display substrate 10 to form a vertical stack in a direction orthogonal to a horizontal surface of a display substrate 10. The controller layer 31 and the iLED layer 41 together make up the pixel layer 21 of the pixels 20.

In the exemplary embodiment shown in FIG. 1B, the controller layer 31, including the pixel control device 30, is disposed between the iLED layer 41 and the display substrate layer 11. In this embodiment, the iLEDs 48 of the iLED devices 40 are disposed to emit light 60 in a direction opposite the display substrate 10 and the display substrate 10 need not, but can, be transparent.

Referring to FIG. 1C, the iLED layer 41, including the iLED devices 40, is disposed between the controller layer 31, including the pixel control device 30, and the display substrate layer 11. In this embodiment, the display substrate 10 is at least partly transparent to the light 60 emitted by the iLEDs 48 of the iLED devices 40 (for example greater than 50%, 70%, 80%, 90%, or 95% transparent), and the iLEDs 48 are disposed to emit light 60 through the display substrate 10.

Each pixel 20 can include a plurality of iLED devices 40 in an iLED layer 41, for example a red iLED device 40R including a red iLED 48 that emits red light, a green iLED device 40G including a green iLED 48 that emits green light, and a blue iLED device 40B including a blue iLED 48 that emits blue light, all of which in a pixel 20 are electrically connected to and under the control of a common pixel controller 38 and pixel control device 30.

According to various embodiments of the present invention, a display substrate 10 can be any material having two opposing side and a surface suitable for supporting electrical components and integrated circuits, for example as found in the flat-panel display industry. Display substrates 10 can be flexible or rigid and can be or comprise, for example, one or more of glass, plastic, metal, or ceramic, polymer, resin, polyimide, PEN, PET, metal, metal foil, glass, a semiconductor, and sapphire.

In the exemplary embodiments of FIGS. 1A and 1B, the pixel controller 38 of the pixel control devices 30 in pixels 20 can include a pixel control circuit 33 that responds to electrical signals from a display controller (not shown) external to the display area 18, for example through wires or electrical connections formed or provided in, on, over, or in direct contact with the display substrate 10. In response to the electrical signals from the external display controller, the pixel control circuit 33 controls the iLED devices 40 and iLEDs 48, for example through wires or electrical connections formed or provided in, on, over, or in direct contact with the pixel substrate 36. In response to the pixel control circuit 33, the iLEDs 48 in the iLED devices 40 emit light 60.

Pixel controllers 38 can be integrated circuits forming pixel control circuits 33 in a semiconductor structure or substrate, for example bare die semiconductor circuits made in monocrystalline silicon using integrated circuit and photolithographic materials and methods. The semiconductor can be, for example, silicon, CMOS, or a compound semiconductor. The pixel substrate 36 can be the semiconductor substrate in or on which the pixel control circuit 33 is disposed and can be an integrated circuit forming the pixel controller 38. In some embodiments, a pixel controller 38 can be provided, for example as an integrated circuit or a bare semiconductor die, on a dielectric pixel substrate 36 such as a glass or plastic substrate. In some embodiments, a pixel control device 30 includes a pixel controller 38, a pixel circuit 33, and a pixel substrate 36. In some embodiments, a pixel control device 30 can be disposed on a display substrate 10, for example by micro-transfer printing. In particular, according to some embodiments of the present invention, a pixel control circuit 33 is not a thin-film circuit and a display substrate 10 does not include a thin-film semiconductor layer, whether amorphous, polysilicon, or crystalline. Without wishing to be bound by any particular theory, because a pixel controller 38 can be provided in a mono-crystalline semiconductor circuit, it has much higher performance than thin-film circuits.

Similarly, iLED devices 40 can, for example, include a compound semiconductor iLED substrate 43 or structure in or on which one or more iLEDs 48 are disposed or formed using integrated circuit and photolithographic methods and materials. An iLED substrate 43 can be a compound iLED semiconductor substrate. In some embodiments, an iLED substrate 43 can be a dielectric (for example including glass or plastic) on which one or more iLEDs 48 (for example formed in a compound semiconductor structure) are disposed. In certain embodiments, an iLED substrate 43, pixel substrate 36, and display substrate 10 are all separate, independent, and distinct and can be made at different times in different places using different processes and are provided in different layers.

Referring to FIGS. 2A, 2B, 2C, 2D, 3A, and 3B, either the iLED devices 40 or the pixel control devices 30, or both, can each also include a broken or separated tether 50 (e.g., a portion thereof). The iLED devices 40 or the pixel control devices 30 can be micro-transfer printed from a corresponding iLED device source wafer or pixel control device source wafer. The source wafers can have released components that are attached to anchor portions of the source wafer by tethers 50, for example as described in U.S. Pat. No. 8,877,648. The tethers 50 are broken or separated, for example during a micro-transfer printing process, for example as described in U.S. Pat. Nos. 8,877,648, 8,039,847, and 7,972,875, the disclosure of each of which is hereby incorporated in their entirety by reference. A broken tether 50 described herein also refers to and includes a separated tether 50.

In the exemplary embodiment illustrated in the schematic cross section of FIG. 2A, the iLED 48 is formed on an iLED device source wafer with one or more tethers 50 to make the micro-transfer printable iLED device 40. The tether 50 can made of a semiconductor material that can be a part of the iLED substrate 43 or iLED 48. In this embodiment, the iLED device source wafer is essentially the same as the iLED source wafer described with respect to FIGS. 2B and 2C below.

In the exemplary embodiment illustrated in the schematic cross section of FIG. 2B, the iLED 48 is micro-transfer printed from an iLED source wafer to an iLED device source wafer, as indicated by the broken tether 50 of the iLED 48. The tether 50 can made of a semiconductor material that can be a part of the iLED substrate 43 or iLED 48. The iLED 48 on the iLED device source wafer is then insulated with a patterned dielectric layer 46 exposing vias that provide access to electrical iLED contacts 42 by pixel electrodes 34 and forming another tether 50 for micro-transfer printing the iLED device 40. Portions of pixel electrodes 34 can optionally be patterned.

In the embodiment illustrated in the schematic cross section of FIG. 2C, the iLED 48 is formed on an iLED device source wafer and then insulated with a patterned dielectric layer 46 exposing vias for iLED contacts 42 and forming a tether 50 for micro-transfer printing the iLED device 40. Pixel electrodes 34 can optionally be patterned.

In the exemplary embodiment shown in FIGS. 2A, 2B, and 2C, the iLED devices 40 can be micro-transfer printed from one or more iLED device source wafers and can include a semiconductor iLED substrate 43 in or on which the iLED 48 is formed. Each iLED device 40 has a tether 50 attached directly or indirectly to the iLEDs 48 and iLED device source wafer. In some embodiments, an iLED device 40 has one or more tethers 50 attached directly or indirectly to iLED(s). The semiconductor iLED substrate 43 can incorporate structures and materials that form the inorganic light-emitting diode 48 and is not separately distinguished in the Figures from the iLED 48. iLED contacts 42 can be metalized contacts on an iLED 48 or simply designated portions of an iLED 48. Pixel electrodes 34 provide electrical signals to an iLED 48 to cause the iLED 48 to emit light 60 (e.g., in accordance with the exemplary embodiments shown in FIGS. 1B, 1C).

Figure 2D:
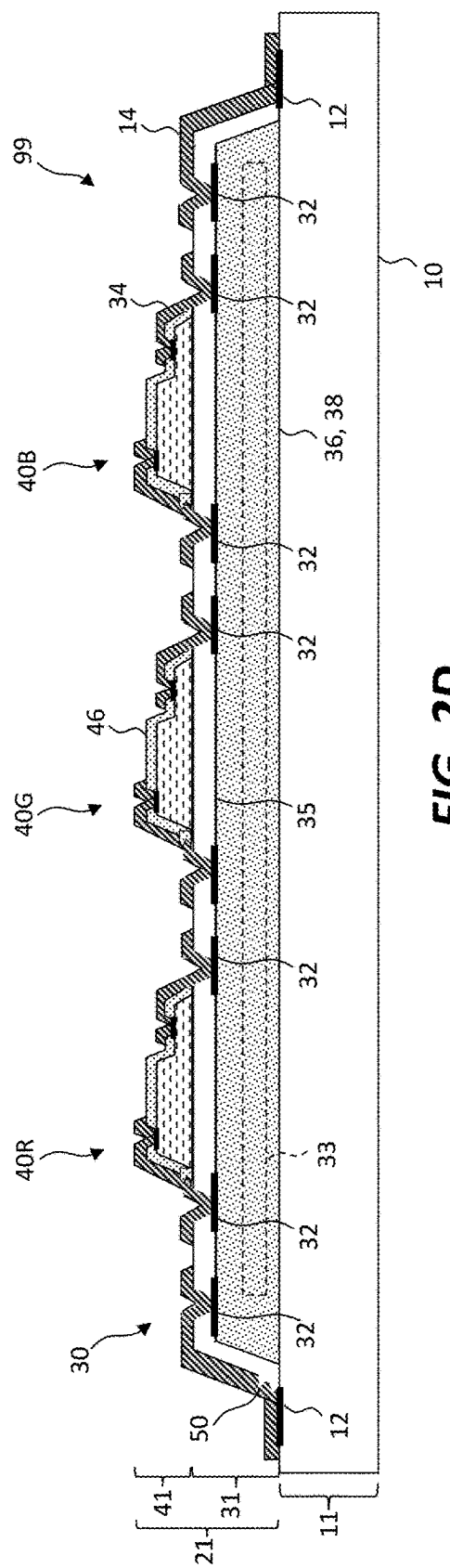
FIG. 2D is a cross section schematic illustrating an iLED display using the structure shown in FIG. 2B, according to illustrative embodiments of the present invention.

Referring to FIG. 2D, the iLED devices 40 of any one of FIGS. 2A, 2B, and 2C can be micro-transfer printed from the one or more iLED device source wafers onto a pixel dielectric layer 35 provided over the pixel controller 38 of the pixel control device 30. A different iLED source wafer can be used for each iLED device 40 in a pixel 20 (for example when a pixel 20 has three iLED devices 40 each emitting a different color of light). If the iLED devices 40 of FIG. 2A are micro-transfer printed from the iLED device source wafer, the patterned iLED dielectric structure 46 is formed when the iLED devices 40 are on the pixel controller 38. FIG. 2D illustrates the iLED devices 40 of FIG. 2C micro-transfer printed onto the pixel control device 30. In some embodiments, an iLED dielectric layer 46 and a pixel dielectric layer 35 are both patterned in a common step after iLED device(s) 40 are micro-transfer printed to a pixel control device 30. iLED contacts 42 (e.g., as shown in FIGS. 2A-2C) of iLED device(s) 40 can be electrically connected to pixel contact(s) 32 of a pixel control device 30 using photolithographic processes, for example relatively high-resolution processes using evaporated or sputtered metals patterned using photoresist masks.

As shown in FIG. 2D, pixel control devices 30 can include one or more tethers 50. In some embodiments, pixel control devices 30 can be micro-transfer printed from a pixel controller source wafer. One or more tethers 50 can be a part of the pixel controller substrate 36 (not shown) or part of a dielectric material such as the patterned pixel dielectric layer 35 (as shown in FIG. 2D) of the pixel control device 30. These variations are similar to those shown for the iLED device 40 in FIGS. 2A and 2B, where a tether 50 is a part of or connected to an iLED substrate 43 or a tether 50 is a part of or connected to an iLED dielectric layer 46 for an iLED device 40. As is true for the source wafers of iLED devices 40 shown in FIGS. 2A-2C, a pixel controller source wafer can be substantially the same as a pixel control device source wafer.

A pixel dielectric layer 35 can be formed on or in direct contact with a pixel control circuit 33 of a pixel controller 38 and a iLED device 40 can be disposed on the pixel dielectric layer 35. The pixel dielectric layer 35 insulates the iLED device 40 from the pixel control circuit 33, for example when the pixel control device 30 includes a bare semiconductor die (that can be the pixel controller 38). In the exemplary embodiment shown in FIG. 2D, the pixel substrate 36 is the semiconductor substrate on or in which the pixel control circuit 33 of the pixel controller 38 is formed and the pixel substrate 36 and the pixel controller 38 are not distinguished in the Figures. In some embodiments, pixel electrodes 34 are electrically connected to (i) iLED contacts 42 through vias in a iLED dielectric layer 46, (ii) to pixel contacts 32 through vias in a pixel dielectric layer 35, (iii) to a pixel control circuit 33 of a pixel control device 30 in a pixel 20, or any combination thereof. In some embodiments, pixel contacts 32 are electrically connected to display substrate contacts 12. Pixel contacts 32 can be, inter alia, metalized contacts on a pixel semiconductor substrate 38 or simply designated portions of a pixel semiconductor substrate 38.

As shown in FIG. 2D, a display substrate 10 can include display substrate contacts 12 connected to wires (not shown in FIG. 2D, see FIG. 6) on the display substrate 10 and a display controller (not shown) external to a display area 18 (see FIG. 6) of the display substrate 10. In some embodiments of the present invention, pixel control devices 30 are micro-transfer printed from one or more pixel control device source wafers on or in which the pixel control devices 30 are formed or disposed and then pixel contacts 32 are electrically connected to display substrate contacts 12 using photolithographic processes, for example relatively low-resolution printed-circuit board processes.

In some embodiments, iLED device(s) 40 are micro-transfer printed onto a pixel control device 30 when the pixel control device 30 is already disposed on a display substrate 10. The iLED devices 40 can then be electrically connected to pixel contacts 32 on the pixel control device 30 and the pixel contacts 32 electrically connected to display substrate contacts 12 one the display substrate 10 in a common step.

In some embodiments, iLED device(s) 40 are micro-transfer printed onto a pixel control device 30 when the pixel control device 30 is part of (e.g., disposed on) a pixel control device source wafer and then the pixel control device 30, with the interconnected iLED devices, is micro-transfer printed onto a display substrate 10. In some embodiments, iLED device(s) 40 are electrically connected to a pixel control device 30 on a pixel control device source wafer using high-resolution integrated circuit wafer processes (semiconductor processes). A pixel control device 30 can then be electrically connected to a display substrate 10 using relatively low-resolution printed-circuit board processes. In some embodiments, iLED device(s) 40 are electrically connected to a pixel contacts 32 after pixel control devices 30 are micro-transfer printed to a display substrate 10 and the pixel contacts 32 are electrically connected to display substrate contacts 12 and iLED contacts 42 in a common step.

In the exemplary embodiment of FIGS. 2A, 2B, and 2C, the iLED device 40 can include an iLED 48 formed in a semiconductor iLED substrate 43, iLED contacts 42, a patterned iLED dielectric layer 46 insulating the iLED 48 (FIG. 2B), and a broken tether 50 (FIGS. 2B and 2C). In some embodiments, a semiconductor iLED substrate 43 and an iLED 48 are substantially the same structure or substrate and are not distinguished in the Figures. An iLED 48 and semiconductor iLED substrate 43 or iLED device 40 can be an unpackaged or bare compound semiconductor structure with one or more doped layers or structure and formed as is known in the inorganic LED arts. Similarly, a pixel control device 30 can include a pixel controller 38 formed as the integrated circuit semiconductor substrate that is a semiconductor pixel substrate 36, pixel contacts 32, a patterned pixel dielectric layer 35 insulating the pixel controller 38, and a broken tether 50. In some embodiments, a semiconductor pixel substrate 36 and a pixel controller 38 can all be the same structure or substrate (and may not be distinguished in the Figures). A pixel controller 38, semiconductor pixel substrate 36, or pixel control device 30 can be an unpackaged or bare semiconductor structure with one or more doped layers or structures and formed as is known in the integrated circuit arts.

Figure 3A:
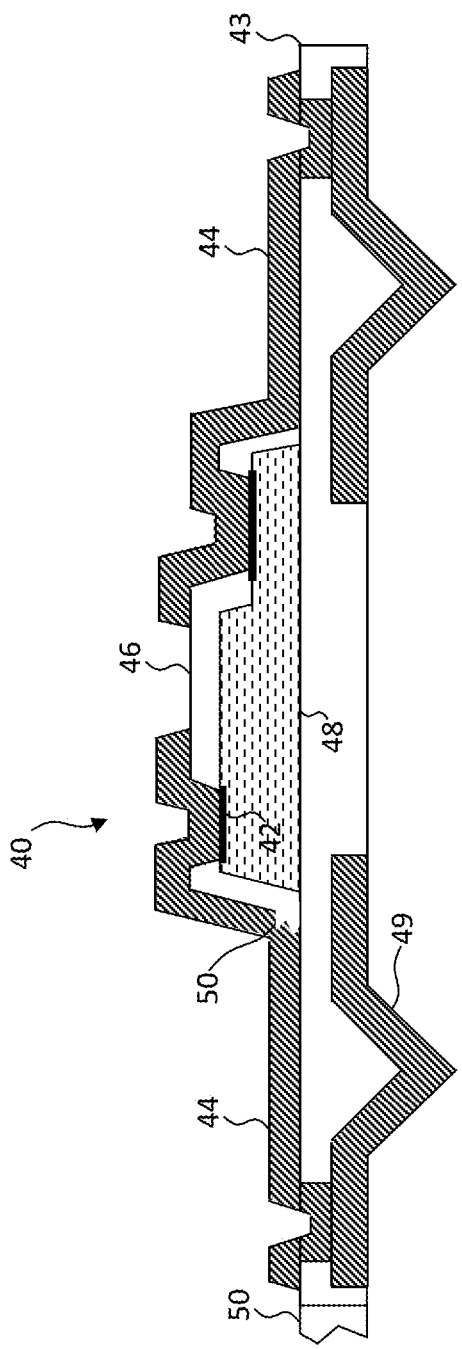
FIG. 3A is a cross section schematic illustrating an iLED device with connection posts, according to illustrative embodiments of the present invention.

Referring to FIG. 3A, the iLED device 40 also includes a dielectric iLED substrate 43. In some embodiments, an iLED device 40 includes an iLED 48 that is disposed or formed, on, over, or in direct contact with a dielectric iLED substrate 43. An iLED 48, iLED contacts 42, patterned iLED dielectric layer 46, and broken tether 50 can be as illustrated in FIG. 2A. In some embodiments, an iLED device 40 also includes a dielectric iLED substrate 43 on which the light-emitting diode 48 is disposed. A broken or separated tether 50 is also connected to or incorporated in the dielectric iLED substrate 43. Furthermore, in some embodiments, an iLED 48 can be micro-transfer printed onto a dielectric iLED substrate 43 (e.g., the iLED 48 of FIG. 2A) and therefore the iLED 48 also includes one or more broken tethers 50, so that at least two broken tethers 50 are present in an iLED device 40 (e.g., of FIG. 3A).

The iLED device 40 of FIG. 3A also includes connection posts 49. The connection posts 49 protrude through the dielectric iLED substrate 43 and are electrically connected to the iLED contacts 42 through vias in the dielectric iLED substrate 43 with iLED electrodes 44. The iLED device 40 structure illustrated in FIG. 3A can be constructed by providing a wafer with a patterned sacrificial layer and etching the patterned sacrificial layer to form, for example, pyramidal connection post forms in the patterned sacrificial layer. Electrical conductors are patterned over the connection post forms and the dielectric iLED substrate 43 is disposed over the patterned electrical conductors and the patterned sacrificial layer. iLEDs 48 are provided over the dielectric iLED substrate 43, either by micro-transfer printing the iLED 48 from an iLED source wafer on or in which the iLED 48 is made onto the dielectric iLED substrate 43 or by forming the iLED 48 on or over a semiconductor layer disposed on the dielectric iLED substrate 43 using integrated circuit and photolithographic materials and methods. Vias in the dielectric iLED substrate 43 are etched and the iLED electrodes 44 are patterned to electrically connect the connection posts 49 to the iLED contacts 42. The sacrificial portions of the wafer are then removed and the iLED device 40 with connection posts 49 can be micro-transfer printed.

In the exemplary embodiment shown in FIG. 3A, the iLED source wafer is readily distinguished from the iLED device source wafer by the connection posts 49.

Figure 3B:
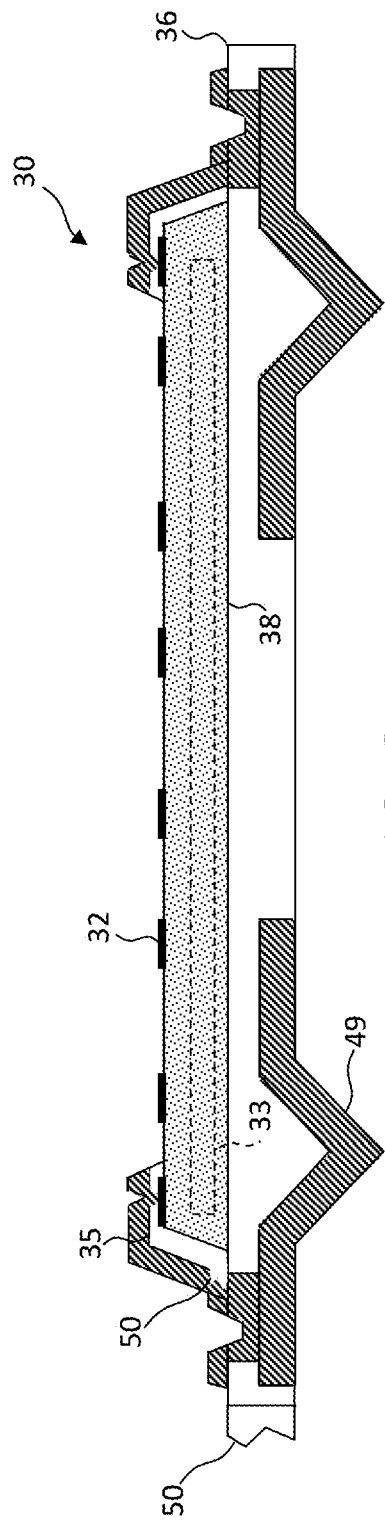
FIG. 3B is a cross section schematic illustrating a pixel control device with connection posts, according to illustrative embodiments of the present invention.

Referring to FIG. 3B, the pixel control device 30 includes connection posts 49, made in or on a dielectric layer forming the pixel substrate 36 using the same process as described with respect to FIG. 3A, except that in this case the pixel controller 38 can be micro-transfer printed from a pixel controller source wafer onto the dielectric pixel substrate 36 and therefore also includes or is connected to a broken tether 50 (either a semiconductor tether 50 or a dielectric tether 50, depending on the photolithographic processing performed on the pixel controller 38 on the pixel controller source wafer and as discussed with respect to FIGS. 2A-2C above). An adhesive layer can be provided and cured on a pixel controller 38 to facilitate micro-transfer printing iLED devices 40 onto a pixel control device 30 (not shown).

In the exemplary embodiment shown in FIG. 3B, the pixel controller source wafer is readily distinguished from the pixel control device source wafer by the connection posts 49.

The iLED device 40 and pixel control device 30 structures shown in FIGS. 3A and 3B can be combined in different ways in various embodiments of the present invention. FIG. 2D illustrates an exemplary embodiment in which the iLED devices 40 shown in FIG. 2A or 2B are disposed on the pixel control device 30 (for example by micro-transfer printing) and electrically connected using photolithographic methods and materials. The pixel control device 30 is disposed on the display substrate 10 (for example by micro-transfer printing) and electrically connected using photolithographic methods and materials. This exemplary embodiment does not include any connection posts 49, either in the iLED device 40 or the pixel control device 30.

Figure 4A:
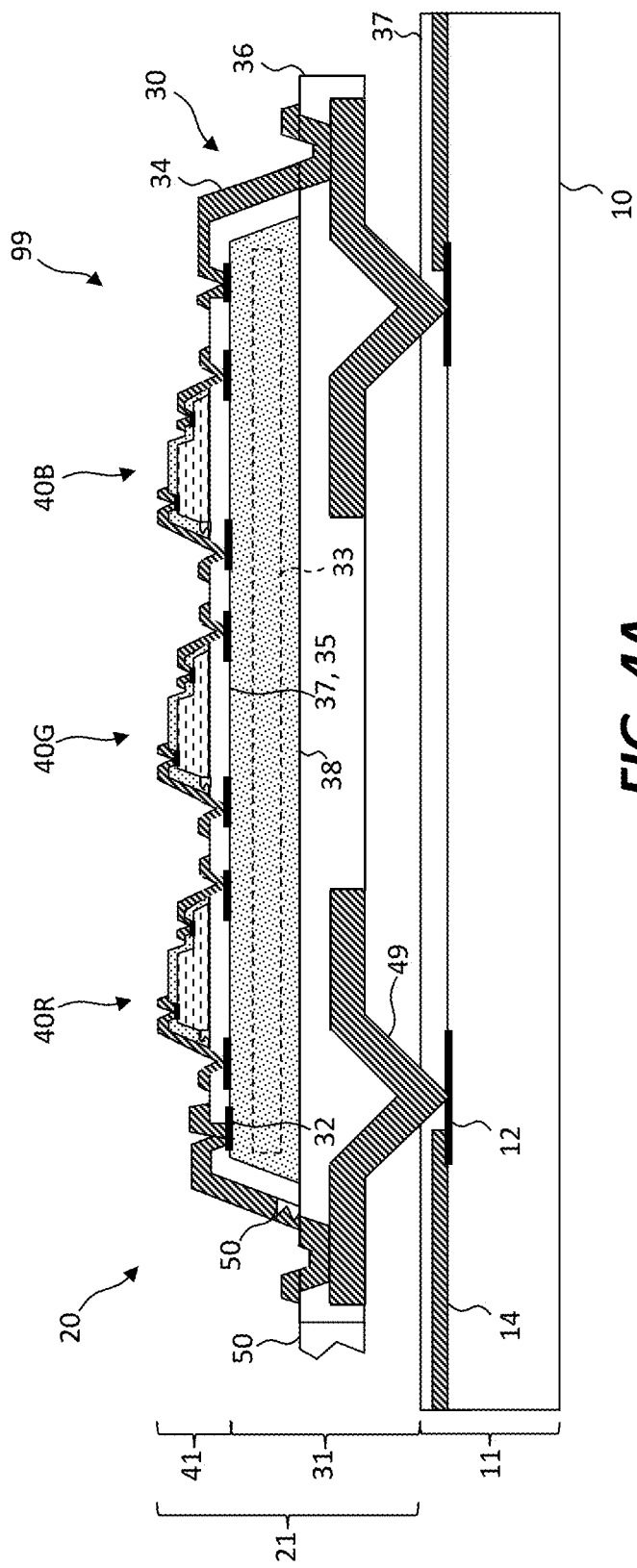
FIG. 4A is a cross section schematic illustrating an iLED display using the iLED device structure shown in FIG. 2A or 2B and the pixel control device structure shown in FIG. 3B, according to illustrative embodiments of the present invention.

Referring to FIG. 4A, the iLED devices 40 of FIG. 2A or 2B are micro-transfer printed onto the pixel control device 30 of FIG. 3B, for example onto pixel control devices 30 on a pixel control device source wafer, and photolithographically connected while on the pixel control device source wafer. In some embodiments, the iLED devices 40 shown in FIG. 2A or 2B are micro-transfer printed onto the pixel controller 38, for example on a pixel controller source wafer, and the pixel controller 38 with the iLED devices 40 is micro-transfer printed from the pixel controller source wafer to a pixel control device source wafer to form the pixel control device 30 shown in FIG. 3B. The iLED devices 40 can be photolithographically connected to the pixel controller 38 while on the pixel control device source wafer in the first case or while on the pixel controller source wafer in the second case. The pixel control device 30 is then micro-transfer printed from the pixel control device source wafer onto the display substrate 10 and the electrical connections between the pixel contacts 32 of the pixel control device 30 and the display substrate contacts 12 of the display substrate 10 are made with the connection posts 49 as a consequence of micro-transfer printing the pixel control device 30 so that no post-printing photolithographic process steps are necessary. An adhesive layer 37 can be provided and cured on the display substrate 10 to facilitate the micro-transfer printing process and electrical connection between the connection posts 49 and the display substrate contacts 12.

Referring to FIG. 4A, the pixel controllers 38 are micro-transfer printed from a pixel controller source wafer directly to a pixel control device source wafer. The iLEDs 48 are micro-transfer printed from an iLED source wafer directly to the pixel control device source wafer and electrically connected, for example with photolithography or using connection posts 49. The pixel control devices 30, with the iLEDs 48 (comprising the iLED devices 40) are micro-transfer printed from the pixel control device source wafer to the display substrate 10 and electrically connected.

Figure 4B:
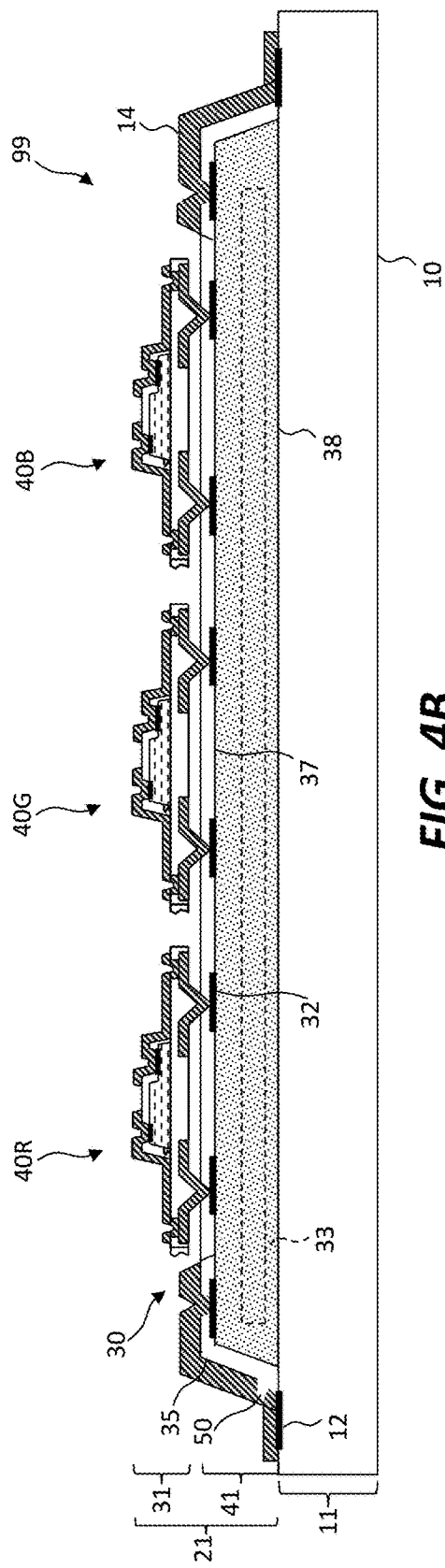
FIG. 4B is a cross section schematic illustrating an iLED display using the iLED device structure shown in FIG. 3A and the pixel control device structure shown in FIG. 2D, according to illustrative embodiments.

Referring to FIG. 4B, the iLED devices 40 illustrated in FIG. 3A are micro-transfer printed onto the pixel control device 30 as described with respect to FIG. 2D, except that, in this case, the connection posts 49 of the iLED device 40 are contacted to the pixel contacts 32 so that no further photolithographic processes are necessary to electrically connect the iLED device 40 to the pixel control device 30. An adhesive layer 37 can be provided and cured to facilitate the micro-transfer printing process and electrical connection between the connection posts 49 and the pixel contacts 32. Thus, the structure of FIG. 4B can require fewer pixel controller process steps than the structure of FIG. 2D.

In the exemplary embodiment shown in FIG. 4B, the iLEDs 48 are micro-transfer printed from an iLED source wafer directly to an iLED device source wafer. The iLED devices 40 are micro-transfer printed from the iLED device source wafer to the pixel control device 30 of the pixel control device source wafer. The pixel control device 30 (including the pixel controller 38) is micro-transfer printed from the pixel control device source wafer directly to the display substrate 10 and electrically connected. In some embodiments, iLED device(s) 40 are micro-transfer printed from an iLED device source wafer to a pixel control device 30 after the pixel control device 30 is micro-transfer printed from a pixel control device source wafer to a display substrate 10.

Figure 4C:
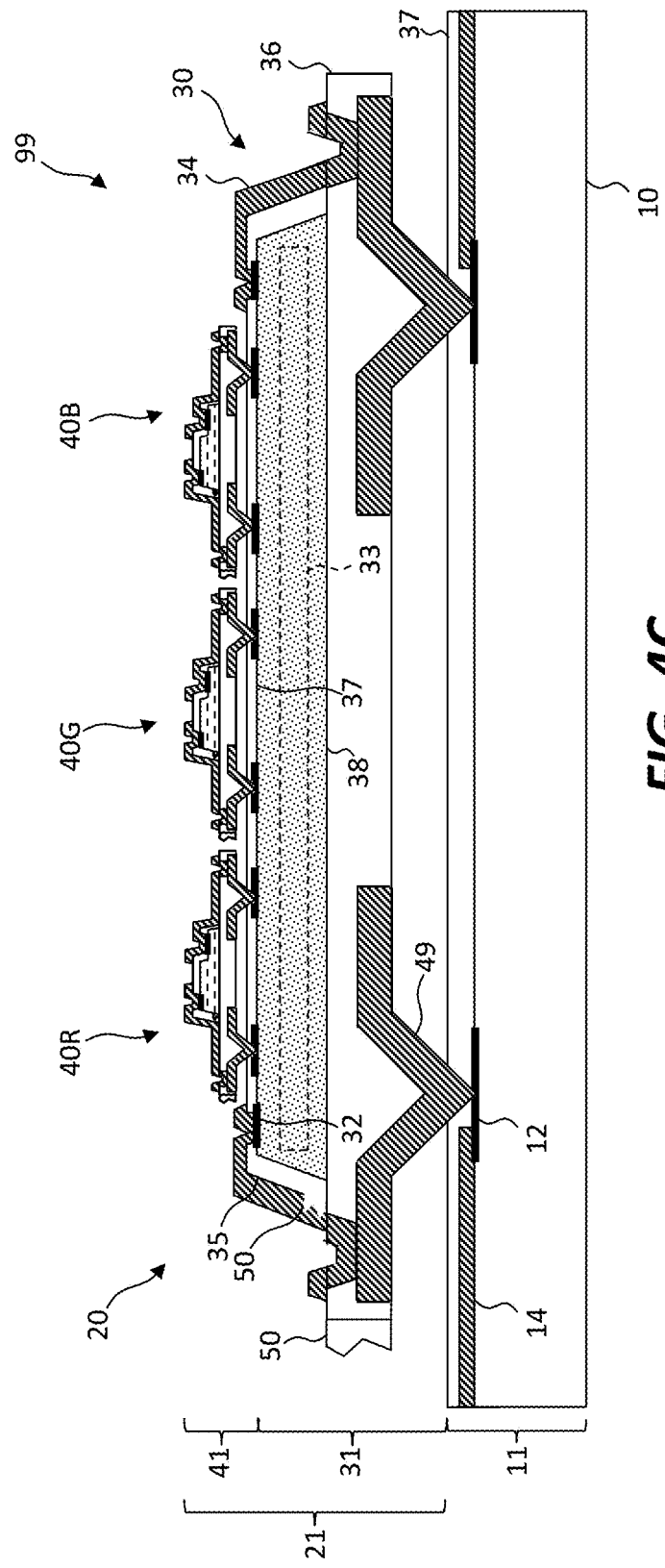
FIG. 4C is a cross section schematic illustrating an iLED display using the iLED device structure shown in FIG. 3A and the pixel control device structure shown in FIG. 3B, according to illustrative embodiments of the present invention.

Referring to FIG. 4C, the iLED devices 40 illustrated in FIG. 3A are micro-transfer printed onto the pixel control device 30 as described with respect to FIG. 3B. In this exemplary embodiment, the connection posts 49 of the iLED device 40 are contacted to the pixel contacts 32 so that no further photolithographic processes are necessary to electrically connect the iLED device 40 to the pixel control device 30. An adhesive layer 37 can be provided and cured on the pixel controller 38 to facilitate the micro-transfer printing process and electrical connection between the connection posts 49 and the pixel contacts 32. The pixel control device 30 is then micro-transfer printed onto the display substrate 10 and the electrical connections between the pixel contacts 32 of the pixel control device 30 and the display substrate contacts 12 of the display substrate 10 are made with the connection posts 49 as a consequence of micro-transfer printing the pixel control device 30 so that no post-printing photolithographic process steps are necessary. An adhesive layer 37 can be provided and cured on the display substrate 10 to facilitate the micro-transfer printing process and electrical connection between the connection posts 49 and the display substrate contacts 12. In some embodiments, iLED device(s) 40 in accordance with the exemplary embodiments shown in FIG. 3A are micro-transfer printed onto a pixel control device 30 after the pixel control device 30 is micro-transfer printed onto a display substrate 10.

In the exemplary embodiment shown in FIG. 4C, the pixel controllers 38 are micro-transfer printed from a pixel controller source wafer directly to a pixel control device source wafer. The iLEDs 48 are micro-transfer printed from an iLED source wafer directly to an iLED device source wafer. The iLED devices 40 are micro-transfer printed from the iLED device source wafer to the pixel control devices 30 of the pixel control device source wafer. In an alternative embodiment, the iLED devices 40 are micro-transfer printed from the iLED device source wafer to the pixel controllers 38 of the pixel controller source wafer and the pixel controllers 38 are micro-transfer printed from the pixel controller source wafer to the pixel control device source wafer. The pixel control devices 30, with the iLED devices 40 are micro-transfer printed from the pixel control device source wafer to the display substrate 10 and electrically connected.

Figure 5A:
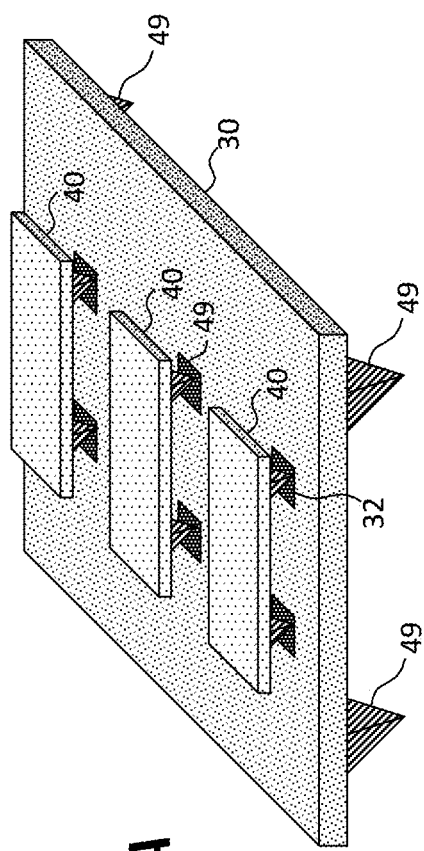
FIG. 5A is a perspective schematic corresponding to FIG. 4C.
Figure 5B:
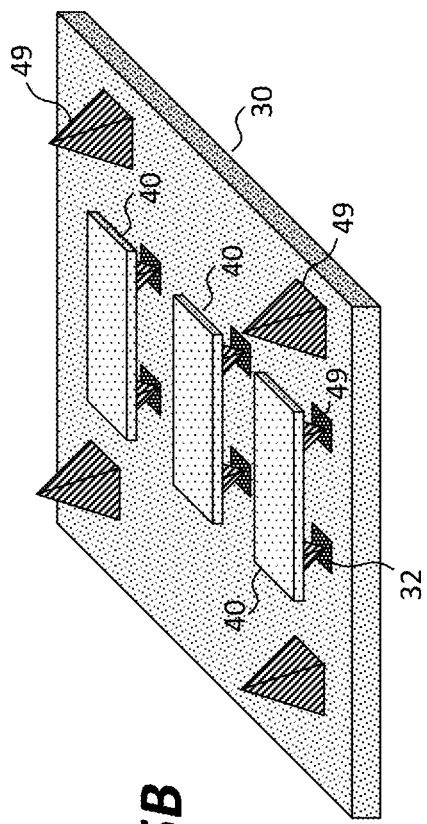
FIG. 5B is a perspective schematic of a structure with a pixel substrate and inverted iLED devices having connection posts, according to illustrative embodiments of the present invention.

FIG. 5A is a perspective illustrating iLED devices 40 micro-transfer printed onto a pixel control device 30 with connection posts 49 forming electrical connections between the iLED devices 40 and pixel contacts of the pixel control device 30. In this exemplary embodiment, the iLED devices 40 are on a side of the pixel control device 30 opposite the connection posts 49 of the pixel control device 30. Referring to FIG. 5B, the iLED devices 40 are on the same side of the pixel control device 30 as the connection posts 49 of the pixel control device 30.

Figure 6:
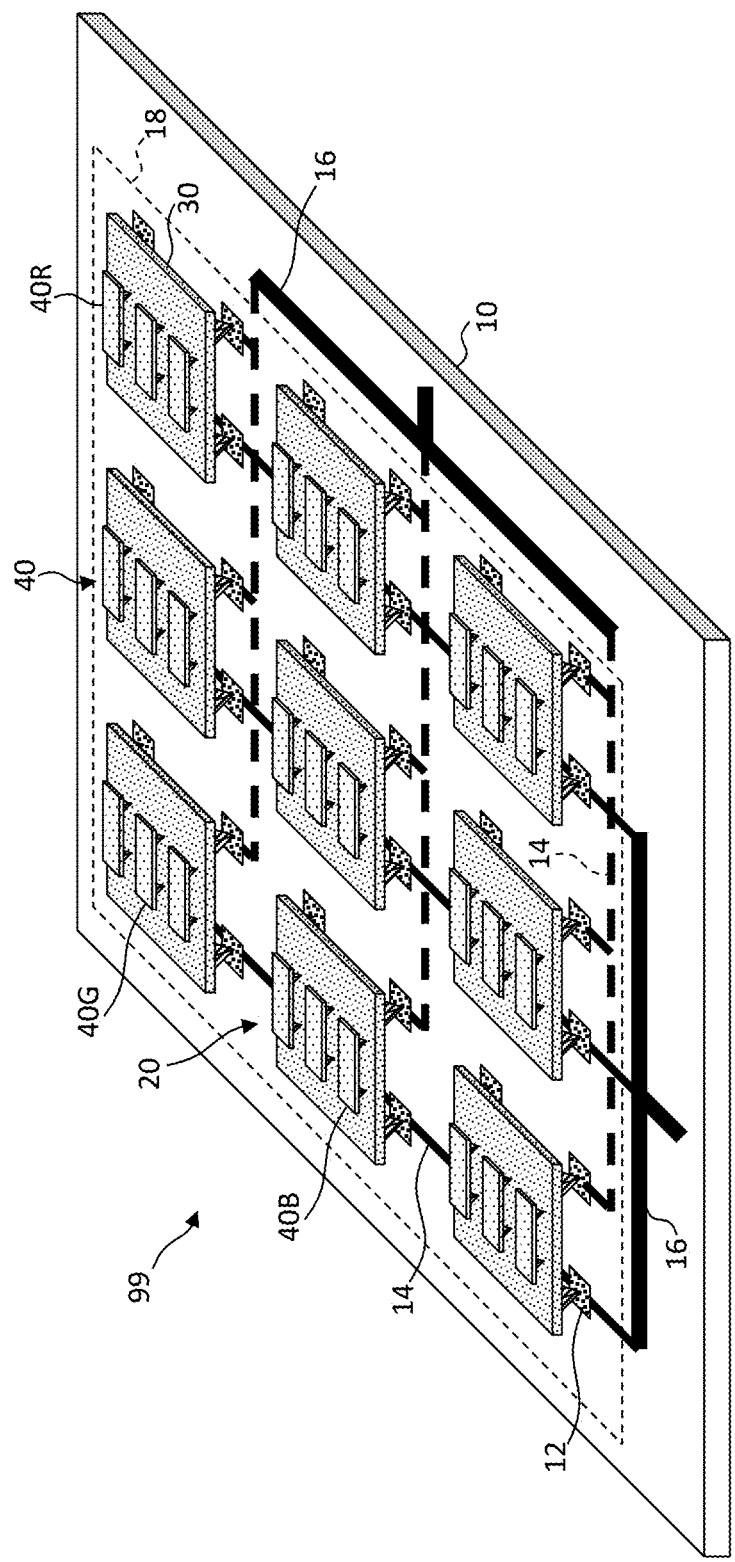
FIG. 6 is a perspective schematic illustrating an iLED display corresponding to FIG. 4C, according to illustrative embodiments of the present invention.

FIG. 6 is a perspective of an exemplary iLED display 99 using the pixels 20 illustrated in FIG. 5A. Each pixel 20 includes a pixel control device 30 with three iLED devices 40, for example a red-light-emitting iLED device 40R, green-light-emitting iLED device 40G, and a blue-light-emitting iLED device 40B, electrically connected to the pixel control device 30. The pixels 20 are electrically connected to display substrate contacts 12 that are, in turn, electrically connected to display substrate electrodes 14 (for example row and column wires) that can be combined into display substrate buses 16 and connected to controllers (not shown) external to the display area 18. In FIG. 6, the row wires are illustrated with dashed lines signifying that they are formed in a different layer over the display substrate 10 than the column wires and are not electrically connected to the column wires.

Figure 7:
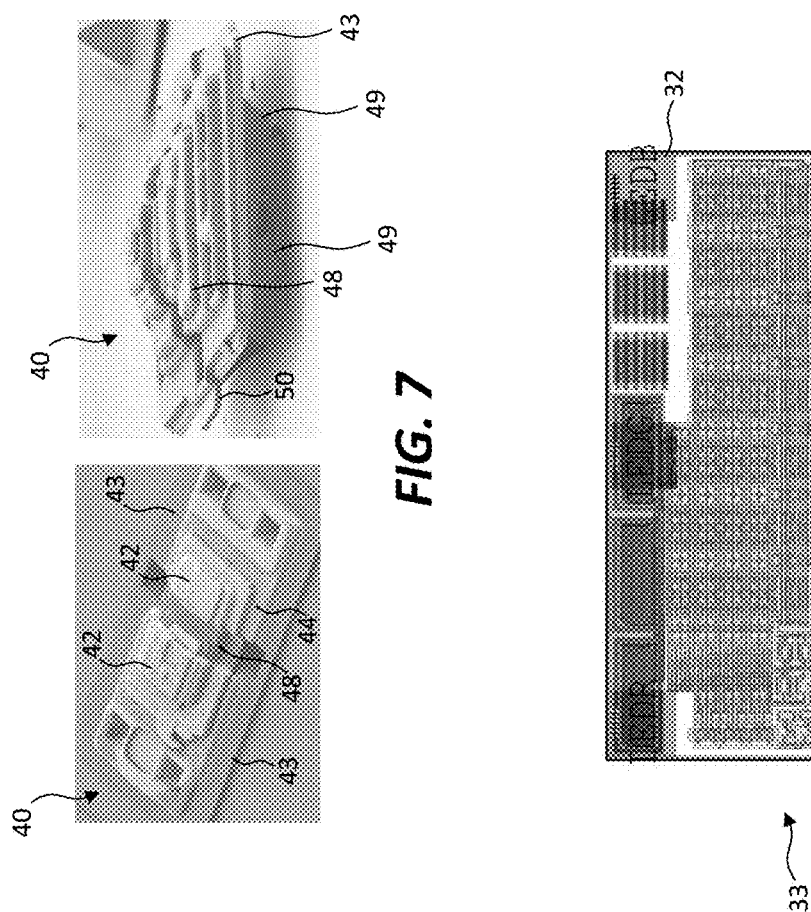
FIG. 7 shows micrographs of an iLED device, according to illustrative embodiments of the present invention.

The micrograph of FIG. 7 shows an iLED device 40 according to some embodiments of the present invention. The iLED device 40 includes two additional, non-functional posts provided to aid printing stability and adhesion to adhesive layer 37 and each iLED electrode 44 is connected to two connection posts 49 to improve stability and electrical connection. The iLEDs 48 are 8×15 microns in size.

Figure 8:
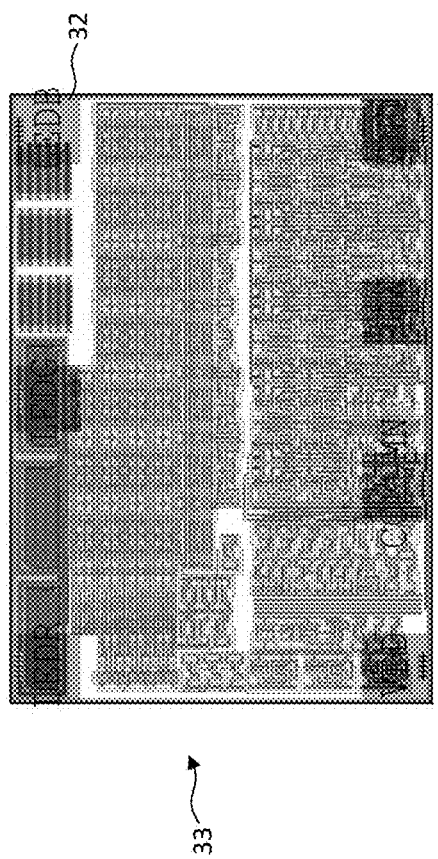
FIG. 8 is a schematic layout of a pixel controller, according to illustrative embodiments of the present invention.

The integrated circuit layout of FIG. 8 shows a pixel control circuit 33 according to some embodiments of the present invention. The pixel control circuit 33 includes three pixel contacts 32, one each for red, green, blue iLED devices 40, a power connection, a ground connection, and column and row control lines. FIG. 8 does not illustrate the pixel contacts 32 for the second LED control signal. The pixel controller 38 is a CMOS digital circuit using pulse width modulation in response to digital control signals supplied by externally controlled row and column lines and has a size of approximately 40×80 microns.

Figure 9:
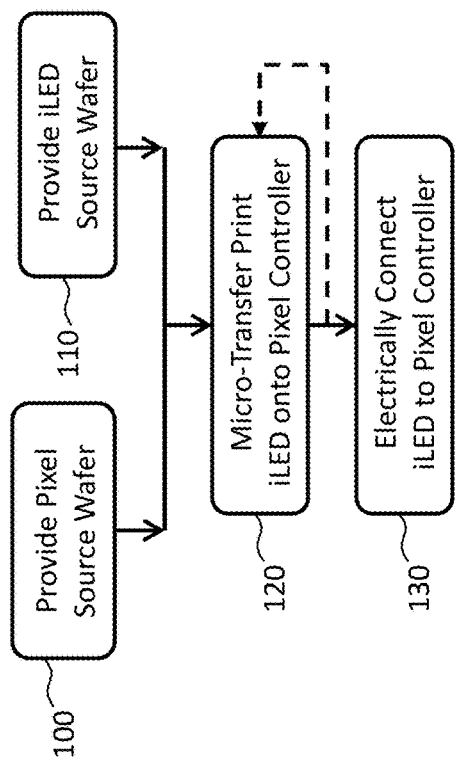

Referring to the flow diagram of FIG. 9, an exemplary method of the present invention, according to some embodiments, includes providing a pixel control device source wafer in step 100 and an iLED device source wafer in step 110. The pixel control device source wafer has pixel control devices 30 and the iLED device source wafer has iLED devices 40. The iLED devices 40 are micro-transfer printed in step 120 from the iLED device source wafer to the pixel control devices 30 of the pixel control device source wafer and electrically connected to the pixel control device 30 in step 130, for example using photolithographic methods and materials.

Figure 10:
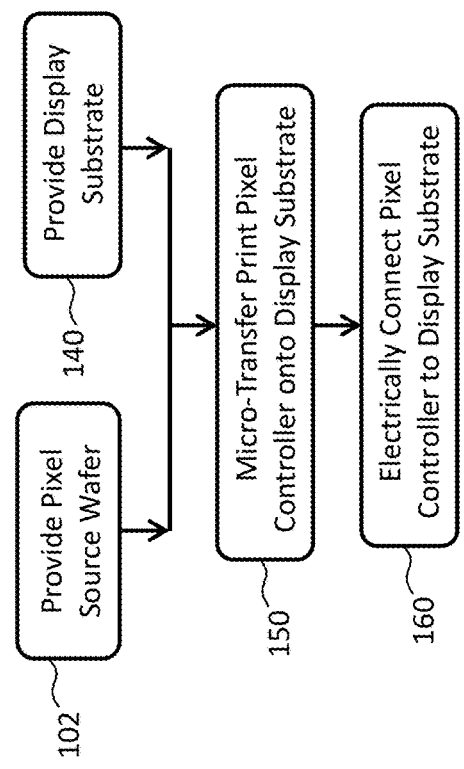
FIGS. 9-10 are flow charts of exemplary methods, according to illustrative embodiments of the present invention.

As illustrated in the flow diagram of FIG. 10, an exemplary method of the present invention, according to some embodiments, includes providing a pixel control device source wafer in step 102, for example but not necessarily including electrically connected pixel control devices 30 and iLEDs 40 as described with respect to step 130 of FIG. 9, and a display substrate 10, for example including display substrate contacts 12, in step 140. The pixel control devices 30 are micro-transfer printed in step 150 from the pixel control device source wafer to the display substrate 10 and electrically connected to the display substrate contacts 12 in step 160, for example using printed circuit board methods and materials.

Figure 11B:
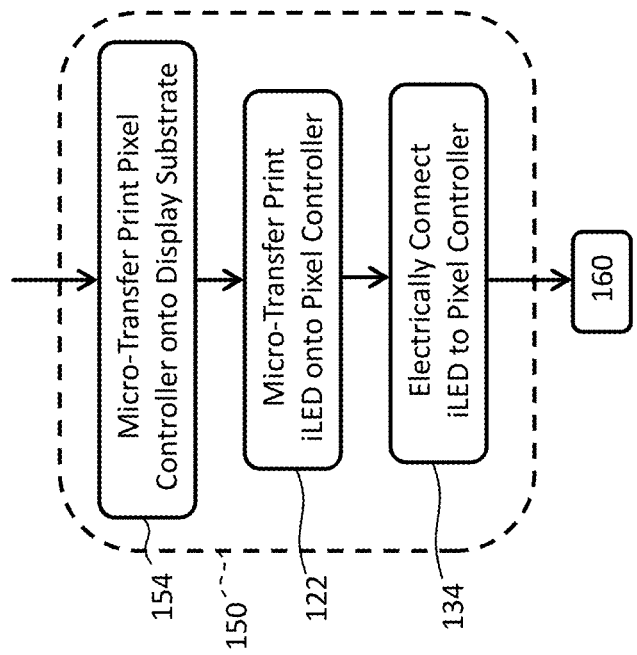
FIGS. 11A-11C are flow charts of exemplary methods that can be used in conjunction with the exemplary method shown in FIG. 10, according to illustrative embodiments of the present invention.
Figure 11A:
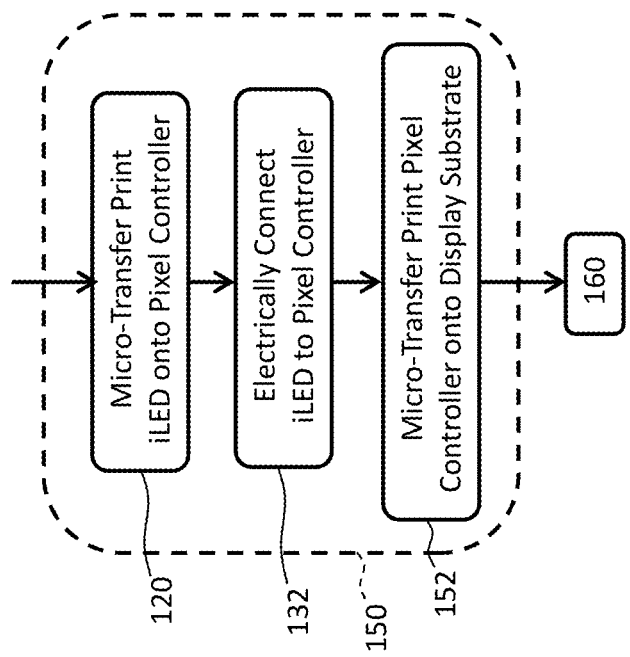

Referring to FIGS. 11A and 11B, the step 150 of micro-transfer printing the pixel control devices 30 from the pixel source wafer to the display substrate 10 is illustrated in alternative methods. As shown in FIG. 11A, the iLED devices 40 are micro-transfer printed from the iLED device source wafer to the pixel control devices 30 of the pixel control device source wafer in step 120. In step 132, the pixel control devices 30 are electrically connected to the iLED devices 40, for example using high-resolution photo-lithographic methods and materials or connection posts 49. In step 152, the electrically connected pixel control devices 30 and iLED devices 40 are micro-transfer printed onto the display substrate 10.

As shown in FIG. 11B, the pixel control devices 30 are micro-transfer printed from the pixel control device source wafer to the display substrate 10 in step 154. The iLED devices 40 are micro-transfer printed from the iLED device source wafer to the pixel control devices 30 of the display substrate 10 in step 122. In step 134, the pixel control devices 30 are electrically connected to the iLED devices 40, for example using low-resolution printed circuit board methods and materials.

Figure 11C:
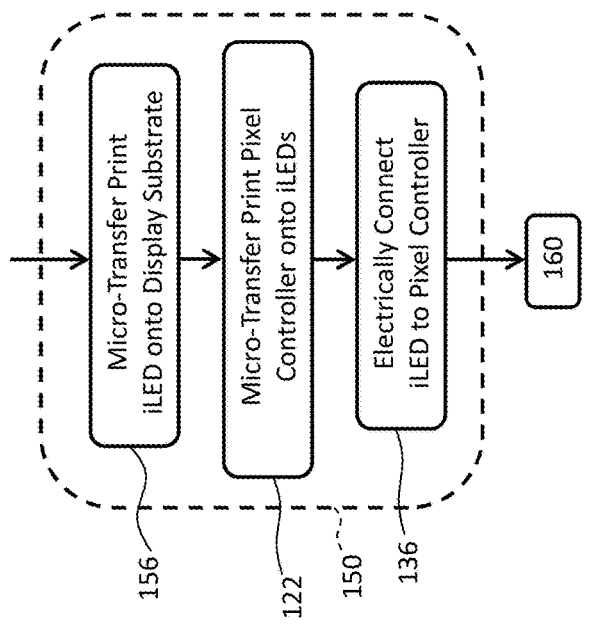

In some embodiments, referring to FIG. 11C, the iLED devices 40 are micro-transfer printed from the iLED device source wafer to the display substrate 10 in step 156. The pixel control devices 30 are micro-transfer printed from the pixel control device source wafer onto the iLED devices 40 in step 122, and electrically connected in step 136, for example by using connection posts 49.

Various embodiments of the present invention can include micro-transfer printable structures, source wafers on or in which micro-transfer printable structures are made, destination substrates on which micro-transfer printable structures are micro-transfer printed, or methods of making the micro-transfer printable structures, source wafers, or destination substrates. As used herein, a source wafer is a wafer from which devices or structures formed on or in the source wafer are micro-transfer printed to a destination substrate or wafer.

Each iLED 48 can be, according to various embodiments, a light-emitting diode (LED), a micro-LED, a laser, a diode laser, or a vertical cavity surface emitting laser and can include known light-emitting diode and/or laser materials and structures. iLEDs 48 can comprise an inorganic solid single-crystal direct bandgap light emitter, can emit visible light, such as red, green, blue, yellow, or cyan light, violet, or ultra-violet light, and can emit either coherent or incoherent light and can include phosphors, quantum dots, or other color conversion materials. iLEDs 48 used herein can have at least one of a width from 2 to 5 μm, 4 to 10 μm, 10 to 20 μm, or 20 to 50 μm, a length from 2 to 5 μm, 4 to 10 μm, 10 to 20 μm, or 20 to 50 μm, and a height from 2 to 5 μm, 4 to 10 μm, 10 to 20 μm, or 20 to 50 μm.

A discussion of micro-iLEDs 48 and micro-LED displays can be found in U.S. Pat. No. 9,520,537, issued Dec. 13, 2016, entitled Micro Assembled Micro LED Displays and Lighting Elements, the disclosure of which is hereby incorporated by reference in its entirety. Micro-transfer methods are described in U.S. Pat. Nos. 8,722,458, 7,622,367 and 8,506,867, the disclosure of each of which is hereby incorporated by reference.

Pixel control devices 30 in accordance with certain embodiments of the present invention can be constructed using compound micro-assembly techniques (e.g., can be compound micro-systems). A discussion of compound micro-assembly structures and methods is provided in U.S. patent application Ser. No. 14/822,868, filed Sep. 25, 2014, entitled Compound Micro Assembly Strategies and Devices, the disclosure of which is hereby incorporated by reference in its entirety.

In general, structures, features, and elements of the present invention can be made using photolithographic methods and materials found in the integrated circuit arts, and the light-emitting diode arts, for example including doped or undoped semiconductor materials, conductors, passivation layers, patterned dielectric layers, electrical contacts, and controllers.

As is understood by those skilled in the art, the terms "over" and "under" are relative terms and can be interchanged in reference to different orientations of the layers, elements, and substrates included in the present invention. For example, a first layer or device on a second layer, in some implementations means a first layer or device directly on and in contact with a second layer. In other implementations a first layer or device on a second layer includes a first layer or device and a second layer with another layer there between.

Having described certain implementations of embodiments, it will now become apparent to one of skill in the art that other implementations incorporating the concepts of the disclosure may be used. Therefore, the invention should not be limited to the described embodiment, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances (e.g., in some embodiments) can be conducted simultaneously. The invention has been described in detail with particular reference to certain embodiments thereof, but it will be understood that variations and modifications can be effected within the spirit and scope of the invention.

PARTS LIST

A cross section
10 display substrate
11 display substrate layer
12 display substrate contact
14 display substrate electrode
16 display substrate bus
18 display area
20 pixel
21 pixel layer
30 pixel control device
31 controller layer
32 pixel contact
33 pixel control circuit
34 pixel electrode
35 pixel dielectric layer
36 pixel substrate
37 adhesive layer
38 pixel controller
40 inorganic light-emitting diode (iLED) device
40R red-light-emitting iLED device
40G green-light-emitting iLED device
40B blue-light-emitting iLED device
41 iLED layer
41 iLED contact
42 iLED substrate
43 iLED electrode
44 iLED dielectric layer
48 iLED
49 connection post
50 tether
60 light
99 iLED display
100 provide pixel source wafer step
102 provide pixel source wafer step
110 provide iLED source wafer step
120 micro-transfer print iLED onto pixel controller step 122 micro-transfer print pixel controller onto iLED step
130 electrically connect iLED to pixel controller step
132 electrically connect iLED to pixel controller step
134 electrically connect iLED to pixel controller step
136 electrically connect iLED to pixel controller step
140 provide display substrate step
150 micro-transfer print pixel controller onto display substrate step
152 micro-transfer print pixel controller onto display substrate step
154 micro-transfer print pixel controller onto display substrate step
156 micro-transfer print iLED onto display substrate step
160 electrically connect pixel controller to display substrate step

The invention claimed is:

1. A high-resolution inorganic light-emitting diode (iLED) display, comprising:
a display substrate having a display area; and
a plurality of pixels disposed over the display substrate in the display area, each pixel comprising a pixel control device and one or more inorganic light-emitting diode (iLED) devices electrically connected to and controlled by the pixel control device to emit light, wherein, for each of the pixels:
the pixel control device comprises a pixel controller that is disposed or formed in, on, or in direct contact with a pixel substrate separate, independent, and distinct from the display substrate,
the one or more iLED devices each comprise an iLED that is disposed or formed in, on, or in direct contact with an iLED substrate separate, independent, and distinct from the display substrate and from the pixel substrates,
the one or more iLED devices are disposed in direct contact with the pixel control device and do not extend beyond the pixel controller, and
the pixel controller is disposed in a controller layer over the display substrate and the one or more iLED devices are disposed in an iLED layer different from the controller layer over the display substrate.

2. The high-resolution iLED display of claim 1, wherein the iLED layer is disposed between the controller layer and the display substrate, the display substrate is at least partly transparent to the light emitted by the iLED, and the iLED is disposed to emit light through the display substrate.

3. The high-resolution iLED display of claim 1, wherein the controller layer is disposed between the iLED layer and the display substrate and the iLEDs are disposed to emit light in a direction away from the display substrate.

4. The high-resolution iLED display of claim 1, wherein one or more of the one or more iLED devices, the iLED substrate, the pixel control device, and the pixel substrate comprises a broken or separated tether.

5. The high-resolution iLED display of claim 1, wherein the iLED substrate comprises a semiconductor iLED substrate or a dielectric iLED substrate.

6. The high-resolution iLED display of claim 5, wherein the pixel control device comprises connection posts electrically connecting the pixel controller to the display substrate.

7. The high-resolution iLED display of claim 5, wherein the iLED substrate comprises a broken or separated tether.

8. The high-resolution iLED display of claim 7, wherein the one or more iLED devices comprises three iLED devices disposed in the iLED layer, wherein each of the iLEDs of the three iLED devices emit light of a different color than the iLED of each other iLED device of the three iLED devices.

9. The high-resolution iLED display of claim 1, wherein the one or more iLED devices each comprises connection posts electrically connecting the iLED to at least one of (i) the pixel controller of the pixel control device on which the iLED device is disposed and (ii) the display substrate.

10. The high-resolution iLED display of claim 1, wherein the pixel substrate comprises a semiconductor pixel substrate or a dielectric pixel substrate.

11. The high-resolution iLED display of claim 10, wherein the pixel substrate comprises a broken or separated tether.

12. A micro-assembled pixel, comprising:
a pixel control device comprising a pixel controller and a pixel substrate, the pixel controller formed or disposed in, on, or in direct contact with the pixel substrate; and
one or more inorganic light-emitting diode (iLED) devices, each comprising an iLED and an iLED substrate separate, independent, and distinct from the pixel substrate, the iLED formed or disposed in, on, or in direct contact with the iLED substrate and electrically connected to and controlled by the pixel controller to emit light, wherein
the one or more iLED devices are disposed in direct contact with the pixel control device and do not extend beyond the pixel controller, and
the pixel controller is disposed in a controller layer and the one or more iLED devices are disposed in an iLED layer different from the controller layer over the pixel controller.

13. The micro-assembled pixel of claim 12, wherein (i) the one or more iLED devices each comprise a broken or separated tether or (ii) the pixel control device comprises a broken or separated tether, or both (i) and (ii).

14. The micro-assembled pixel of claim 12, wherein the iLED substrate comprises a semiconductor iLED substrate or a dielectric iLED substrate.

15. The micro-assembled pixel of claim 14, wherein the pixel control device comprises connection posts electrically connected to the pixel controller.

16. The micro-assembled pixel of claim 14, wherein the iLED substrate comprises a broken or separated tether.

17. The micro-assembled pixel of claim 12, wherein the one or more iLED devices each comprises connection posts electrically connecting the iLED to the pixel controller.

18. The micro-assembled pixel of claim 12, wherein the pixel substrate comprises a semiconductor pixel substrate or a dielectric pixel substrate.

19. The micro-assembled pixel of claim 18, wherein the pixel substrate comprises a broken or separated tether.

* * * * *